US012701904B2

(12) United States Patent
Lee et al.

(10) Patent No.: US 12,701,904 B2
(45) Date of Patent: Aug. 4, 2026

(54) DISPLAY DEVICE

(71) Applicant: Samsung Display Co., LTD., Yongin-si (KR)

(72) Inventors: Donghyun Lee, Yongin-si (KR); Youn-Woong Kang, Yongin-si (KR); Seokhyun Nam, Yongin-si (KR); Si Joon Song, Yongin-si (KR); Sanghyuck Yoon, Yongin-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 337 days.

(21) Appl. No.: 18/401,901

(22) Filed: Jan. 2, 2024

(65) Prior Publication Data

US 2024/0237491 A1 Jul. 11, 2024

(30) Foreign Application Priority Data

Jan. 6, 2023 (KR) ........................ 10-2023-0002109

(51) Int. Cl.
H10K 59/80 (2023.01)
H10K 59/131 (2023.01)

(52) U.S. Cl.
CPC ......... H10K 59/873 (2023.02); H10K 59/131 (2023.02)

(58) Field of Classification Search
CPC .. H10K 59/873; H10K 59/131; H10K 50/844; H10K 59/40; H10K 59/82; H10K 59/123; H10K 77/111; H10K 2102/311; H10H 20/8316; H10H 20/852; H10H 29/142
See application file for complete search history.

(56) References Cited

U.S. PATENT DOCUMENTS

| | | | |
|---|---|---|---|
| 10,566,554 B2 | 2/2020 | Li et al. | |
| 10,580,846 B2 | 3/2020 | Seo et al. | |
| 11,139,363 B2 | 10/2021 | Oh | |
| 11,244,989 B2 | 2/2022 | Seo et al. | |
| 11,972,069 B2 * | 4/2024 | Jang ...................... | H10K 71/00 |
| 2010/0155724 A1 | 6/2010 | Hong et al. | |
| 2014/0126093 A1 | 5/2014 | Duan et al. | |
| 2016/0336540 A1 | 11/2016 | Li | |

FOREIGN PATENT DOCUMENTS

| | | |
|---|---|---|
| CN | 112366220 A | 2/2021 |
| KR | 20170080224 A | 7/2017 |
| KR | 20180100013 A | 9/2018 |
| KR | 1020200077250 A | 6/2020 |
| KR | 20210049245 A | 5/2021 |

* cited by examiner

*Primary Examiner* — David Vu
(74) *Attorney, Agent, or Firm* — CANTOR COLBURN LLP

(57) ABSTRACT

A display device includes a display panel. The display panel includes a pixel, an encapsulation layer, and a connection electrode connecting a signal line and a pad electrode. The encapsulation layer includes an outer region in which a first inorganic encapsulation layer and the second inorganic encapsulation layer are in contact, and an inner region in which an organic encapsulation layer is disposed. A first connection electrode overlaps the outer region.

37 Claims, 20 Drawing Sheets

DISPLAY DEVICE

This application claims priority to Korean Patent Application No. 10-2023-0002109, filed on Jan. 6, 2023, and all the benefits accruing therefrom under U.S.C. § 119, the content of which in its entirety is herein incorporated by reference.

BACKGROUND

1. Field

The disclosure herein relates to a display device, and more particularly, to a display device enabling rear surface bonding with respect to a flexible printed circuit board.

2. Description of the Related Art

Electronic devices such as smartphones, tablets, laptop computers, car navigation systems, and smart televisions are being developed. These electronic devices are provided with display devices for providing information.

Various types of display devices are being developed to satisfy the user experience/user interface (UX/UI) of users. A display device for providing a wider display region and a smaller non-display region is under development.

SUMMARY

The disclosure provides a display device having a reduced non-display region.

An embodiment of the inventive concept provides a display device including a display panel including a display region and a non-display region, and an input sensor disposed on the display panel. The display panel may include a base layer overlapping the display region and the non-display region, a first pad electrode exposed through a lower surface of the base layer, a plurality of insulating layers disposed on an upper surface of the base layer, a pixel disposed on the upper surface of the base layer and including a light-emitting element overlapping the display region and a transistor electrically connected to the light-emitting element, a signal line disposed on the upper surface of the base layer and overlapping at least the non-display region, a first connection electrode electrically connecting the signal line and the first pad electrode in the non-display region, and an encapsulation layer disposed on the upper surface of the base layer and covering the light-emitting element. The encapsulation layer may include a first inorganic encapsulation layer overlapping the display region and the non-display region, a second inorganic encapsulation layer disposed on the first inorganic encapsulation layer, and an organic encapsulation layer disposed between the first inorganic encapsulation layer and the second inorganic encapsulation layer. In a plan view, the encapsulation layer may include an outer region in which the first inorganic encapsulation layer and the second inorganic encapsulation layer are in contact and an inner region overlapping the organic encapsulation layer. The first connection electrode may overlap the outer region.

In an embodiment of the inventive concept, a display device includes a display panel including a display region and a non-display region, and an input sensor disposed on the display panel. The display panel may include a base layer overlapping the display region and the non-display region, a first pad electrode exposed through a lower surface of the base layer, a second pad electrode exposed through the lower surface of the base layer, a plurality of insulating layers disposed on an upper surface of the base layer, a pixel disposed on the upper surface of the base layer and including a light-emitting element overlapping the display region and a transistor electrically connected to the light-emitting element, a signal line disposed on the upper surface of the base layer and overlapping at least the non-display region, a first connection electrode electrically connecting the signal line and the first pad electrode in the non-display region, a second connection electrode electrically connected to the second pad electrode in the non-display region, and an encapsulation layer disposed on the upper surface of the base layer and covering the light-emitting element. The encapsulation layer may include a first inorganic encapsulation layer overlapping the display region and the non-display region, a second inorganic encapsulation layer disposed on the first inorganic encapsulation layer, and an organic encapsulation layer disposed between the first inorganic encapsulation layer and the second inorganic encapsulation layer. In a plan view, the encapsulation layer may include an outer region in which the first inorganic encapsulation layer and the second inorganic encapsulation layer are in contact and an inner region overlapping the organic encapsulation layer. The input sensor may include at least one sensor insulating layer, a sensing electrode, and a sensor signal line connected to the sensing electrode and connected to the second connection electrode in the non-display region. The second connection electrode may overlap the outer region.

In an embodiment of the inventive concept, a display device includes a display panel including a display region and a non-display region, wherein the display panel includes a base layer overlapping the display region and the non-display region, a pad electrode exposed through a lower surface of the base layer, a pixel disposed on an upper surface of the base layer and including a light-emitting element overlapping the display region and a transistor electrically connected to the light-emitting element, a data line disposed on the upper surface of the base layer, overlapping the display region and the non-display region, and electrically connected to the transistor, a static electricity protection circuit electrically connected to the data line, a connection electrode electrically connecting the data line and the pad electrode in the non-display region, and an encapsulation layer disposed on the upper surface of the base layer and covering the light-emitting element. The encapsulation layer may include a first inorganic encapsulation layer overlapping the display region and the non-display region, a second inorganic encapsulation layer disposed on the first inorganic encapsulation layer, and an organic encapsulation layer disposed between the first inorganic encapsulation layer and the second inorganic encapsulation layer. In a plan view, the encapsulation layer may include an outer region in which the first inorganic encapsulation layer and the second inorganic encapsulation layer are in contact and an inner region overlapping the organic encapsulation layer. The outer region may include a first outer region, and a second outer region extending outward in the plan view from the first outer region and having a smaller thickness than a thickness of the first outer region. The static electricity protection circuit may overlap the first outer region.

BRIEF DESCRIPTION OF THE DRAWINGS

The accompanying drawings are included to provide a further understanding of the inventive concept, and are incorporated in and constitute a part of this specification. The drawings illustrate embodiments of the inventive concept and, together with the description, serve to explain principles of the inventive concept.

In the Drawings:

FIG. 8 is a plan view enlarging a non-display region of an embodiment of a display module according to the inventive concept;

FIG. 10B is a cross-sectional view of a display module corresponding to IV-IV' of FIG. 10A;

FIGS. 11 to 16 are plan views enlarging an embodiment of a non-display region of a display module according to the inventive concept.

DETAILED DESCRIPTION

Figure 1:
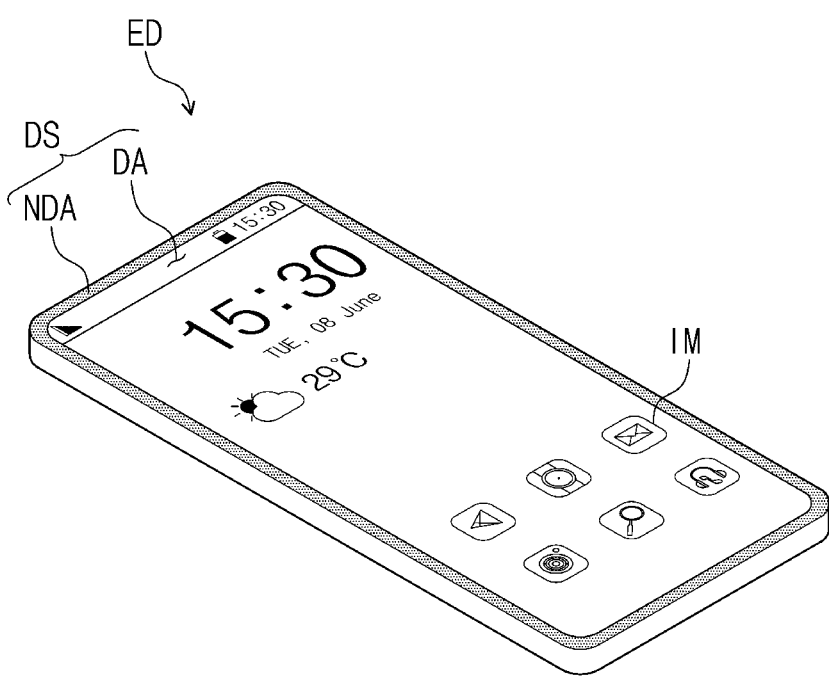
FIG. 1 is a perspective view of an embodiment of an electronic device according to the inventive concept.
Figure 1:
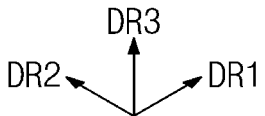

In the description, when an element (or a region, a layer, a portion, and the like) is referred to as being "on," "connected to," or "bonded to" another element, it means that the element may be directly disposed on/connected to/bonded to the other element, or that a third element may be disposed therebetween.

Like reference numerals refer to like elements. In addition, in the drawings, the thickness, the ratio, and the dimensions of elements are exaggerated for an effective description of technical contents. The term "and/or," includes all combinations of one or more of which associated configurations may define.

It will be understood that, although the terms first, second, and the like may be used herein to describe various elements, these elements should not be limited by these terms. These terms are only used to distinguish one element from another element. For example, a first element may be referred to as a second element, and similarly, a second element may be referred to as a first element without departing from the teachings of the present disclosure. The singular forms are intended to include the plural forms as well, unless the context clearly indicates otherwise.

Also, terms of "below", "on lower side", "above", "on upper side", or the like may be used to describe the relationships of the components illustrated in the drawings. The terms are used as a relative concept and are described with reference to the direction indicated in the drawings.

It should be understood that the terms "comprise", or "have" are intended to specify the presence of stated features, integers, steps, operations, elements, components, or combinations thereof in the disclosure, but do not preclude the presence or addition of one or more other features, integers, steps, operations, elements, components, or combinations thereof.

Unless otherwise defined, all terms (including technical and scientific terms) used herein have the same meaning as commonly understood by one of ordinary skill in the art to which the disclosure pertains. It is also to be understood that terms defined in commonly used dictionaries should be interpreted as having meanings consistent with the meanings in the context of the related art, and are expressly defined herein unless they are interpreted in an ideal or overly formal sense. Also, terms, such as those defined in commonly used dictionaries, should be interpreted as having a meaning that is consistent with their meaning in the context of the relevant art and should not be interpreted in an idealized or overly formal sense unless expressly so defined herein.

Hereinafter, embodiments of the inventive concept will be described with reference to the accompanying drawings.

Figure 2:
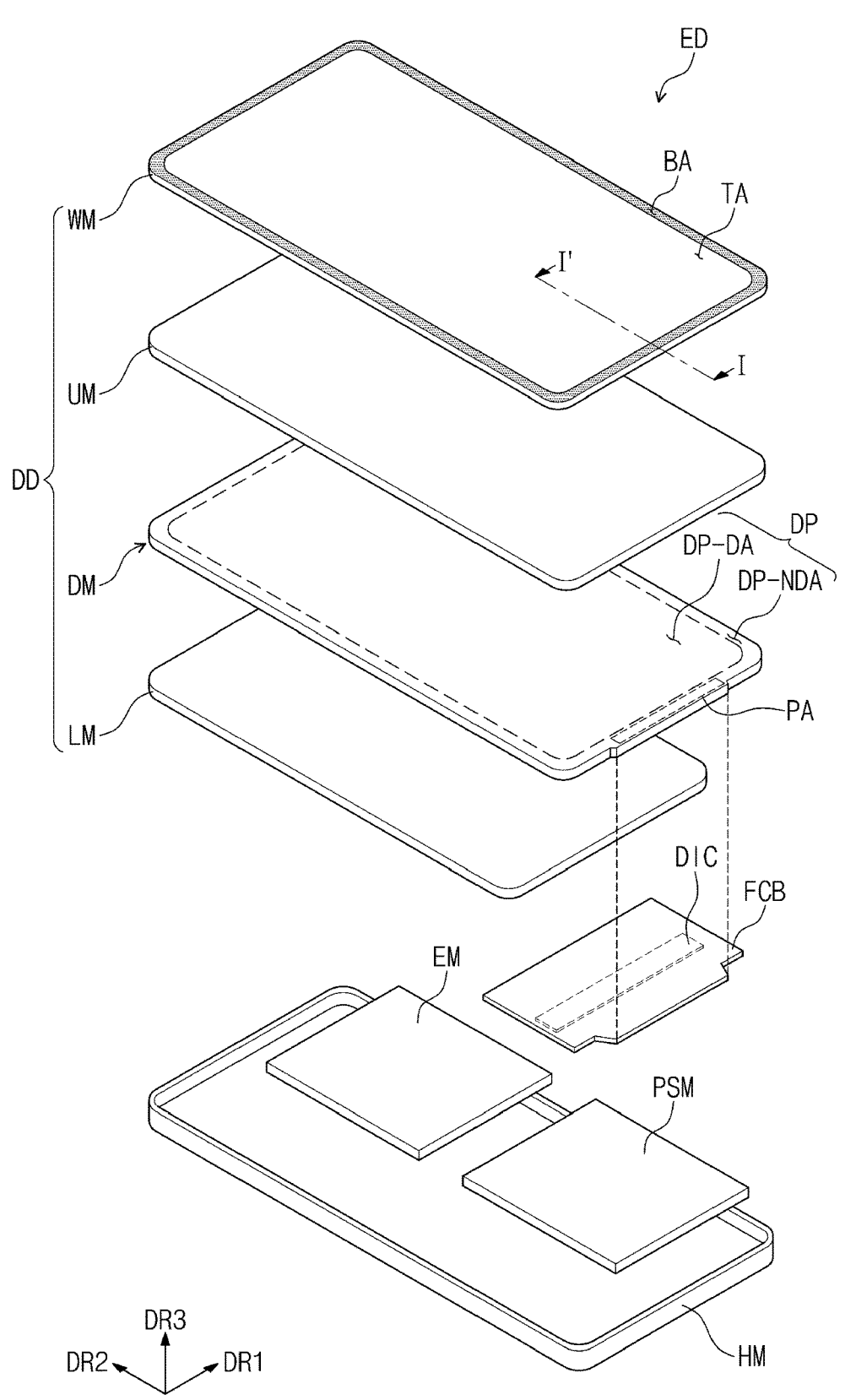
FIG. 2 is an exploded perspective view of an embodiment of an electronic device according to the inventive concept.
Figure 3:
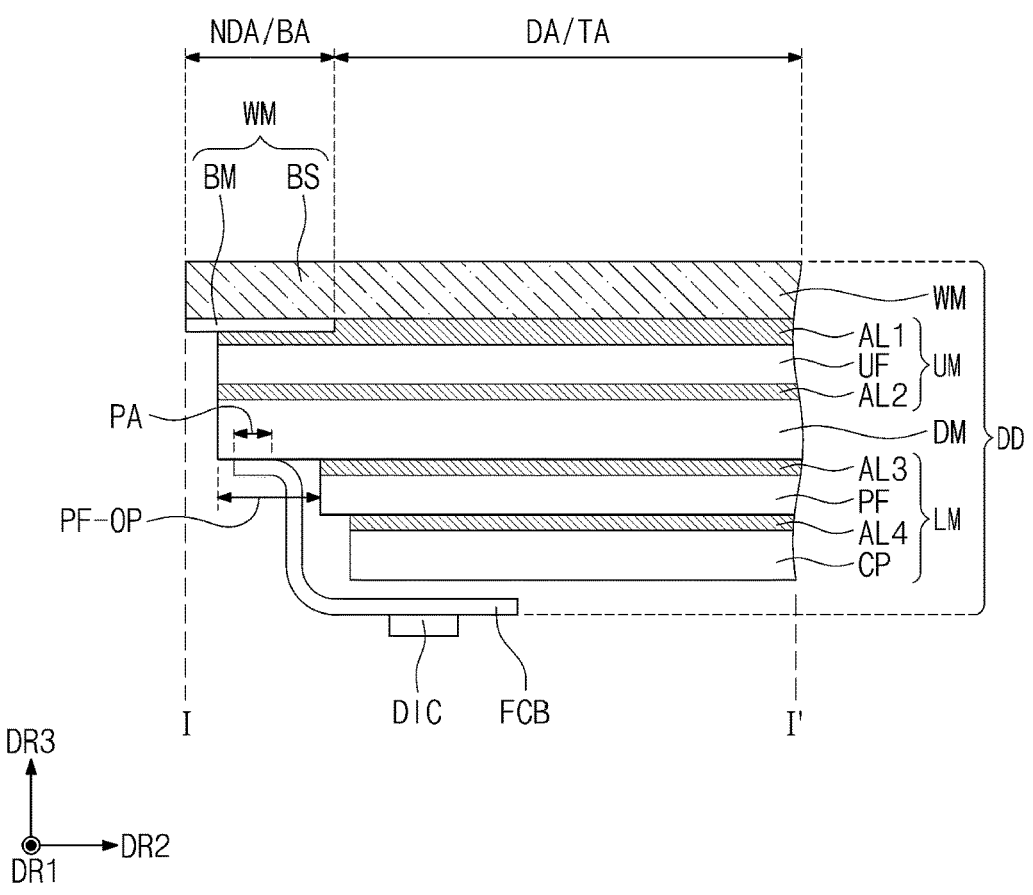
FIG. 3 is a cross-sectional view of a display device corresponding to I-I' of FIG. 2.

FIG. 1 is a perspective view of an embodiment of an electronic device ED according to the inventive concept. FIG. 2 is an exploded perspective view of an embodiment of an electronic device ED according to the inventive concept. FIG. 3 is a cross-sectional view of an embodiment of a display device DD according to the inventive concept.

Referring to FIG. 1, the electronic device ED in an embodiment of the inventive concept may include a display surface DS defined by a first direction DR1 and a second direction DR2 crossing the first direction DR1. The electronic device ED may provide an image IM to users through the display surface DS.

The display surface DS may include a display region DA and a non-display region NDA around the display region DA. The display region DA may display the image IM, and the non-display region NDA may not display the image IM. The non-display region NDA may surround the display region DA. However, the inventive concept is not limited thereto, and the shape of the display region DA and the shape of the non-display region NDA may be modified.

Hereinafter, a direction substantially perpendicularly crossing a plane defined by the first direction DR1 and the second direction DR2 is defined as a third direction DR3. Front and rear surfaces of each member are distinguished from each other with respect to the third direction DR3. In addition, as used herein, "in a plan view" may be defined as a state viewed in the third direction DR3. Hereinafter, the first, second, and third directions DR1, DR2, and DR3 are directions respectively indicated by first, second, and third directional axes, and are assigned with the same reference numerals as those of the first, second, and third directional axes.

In an embodiment of the inventive concept, the electronic device ED may be a foldable electronic device which is foldable around a folding axis. The folding axis may be parallel to the first direction DR1 or the second direction DR2, and a folding region may be defined in a portion of the display region DA. The electronic device ED may be in-folded such that portions of the display region DA face each other, or may be out-folded such that portions of the display region DA are folded away from each other.

As shown in FIG. 2, the electronic device ED may include a display device DD, an electronic module EM, a power module PSM, and a housing HM. FIG. 2 briefly shows the electronic device ED, and the electronic device ED may further include a mechanical structure (e.g., a hinge) designed to control an operation (e.g., folding or rolling) of the display device DD.

The display device DD generates images and detects external inputs. The display device DD includes a window WM, an upper member UM, a display module DM, a lower member LM, a flexible circuit board FCB, and a driving chip DIC. The upper member UM includes members disposed above the display module DM, and the lower member LM includes members disposed below the display module DM.

The window WM provides a front surface of the electronic device ED. The window WM includes a transmission region TA and a bezel region BA. The display region DA and the non-display region NDA of the display surface DS shown in FIG. 1 are defined by the transmission region TA and the bezel region BA. The transmission region TA is a region through which images pass, and the bezel region BA is a region covering structures/members disposed below the window WM.

The display module DM may include at least a display panel DP. FIG. 2 shows only the display panel DP among the stacked structures of the display module DM, but substantially, the display module DM may further include the display panel DP as well as additional components disposed above the display panel DP. Detailed descriptions of the stacked structure of the display module DM will be described later.

The display panel DP is not particularly limited, and may include, e.g., an organic light-emitting display panel or an inorganic light-emitting display panel. The display panel DP includes a display region DP-DA and a non-display region DP-NDA corresponding to the display region DA and the non-display region NDA shown in FIG. 1. As used herein, the phrase "a region/portion corresponds to a region/portion" indicates that they overlap and are not limited to the same area.

A pad region PA of the display panel DP is disposed on one side of the non-display region DP-NDA. The pad region PA is a region electrically bonded (or connected) to a flexible circuit board FCB, which will be described later. In the illustrated embodiment, the pad region PA is defined on a rear surface of the display panel DP.

The display panel DP has a substantially quadrangle shape. The "substantially quadrangle shape" herein includes a quadrangle shape defined mathematically as well as a shape similar to a quadrangle that may be seen as a quadrangle by users. In an embodiment, the substantially quadrangle shape may include a quadrangle shape having rounded corner regions, for example. In addition, the substantially quadrangle shape is not necessarily limited to a straight edge of the display panel DP, and the edge may include a curved region.

The upper member UM may include a protection film or an optical film. The optical film may include a polarizer and a retarder to reduce reflection of external light. The lower member LM may include a protection film protecting the display panel DP, a support member supporting the display panel DP, and a digitizer. Detailed descriptions of the upper member UM and the lower member LM will be described later.

The flexible circuit board FCB shown in FIG. 2 is disposed below the display panel DP. The flexible circuit board FCB may be bonded to the rear surface of the display panel DP and electrically connect the display panel DP and a main circuit board. The flexible printed circuit board FCB includes at least one insulating layer and at least one conductive layer. The conductive layer may include a plurality of signal lines.

The driving chip DIC may be disposed (e.g., mounted) on the flexible circuit board FCB. The driving chip DIC may include driving circuits, e.g., a data driving circuit, for driving pixels of the display panel DP. FIG. 2 shows a structure in which the driving chip DIC is disposed (e.g., mounted) on the flexible circuit board FCB, but the inventive concept is not limited thereto. In an embodiment, the driving chip DIC may be disposed (e.g., mounted) on the display panel DP or on a main circuit board, for example.

The electronic module EM may include a control module, a wireless communication module, an image input module, an audio input module, an audio output module, a memory, and an external interface module. The electronic module EM may include a main circuit board, and the modules may be disposed (e.g., mounted) on the main circuit board or may electrically be connected to the main circuit board through a flexible circuit board. The electronic module EM is electrically connected to a power module PSM.

Separately, the electronic device ED may further include an electro-optical module. The electro-optical module may be an electronic component that outputs or receives optical signals. The electro-optical module may include a camera module and/or a proximity sensor. The camera module may capture external images through a partial region of the display panel DP.

A housing HM shown in FIG. 2 is bonded to the display device DD, particularly a window WM, to accommodate the other modules. The housing HM is shown to have a single body shape, but is not limited thereto. The housing HM may include a plurality of portions (e.g., a side edge portion and a bottom portion) bonded to each other.

FIG. 3 additionally shows adhesive layers AL1 to AL4 which are not shown in FIG. 2. The window WM may include a base substrate BS and a bezel pattern BM disposed on a lower surface of the base substrate BS. The base substrate BS may include a synthetic resin film or a glass substrate. The base substrate BS may have a multilayer structure. The base substrate BS may include a thin film glass substrate, a protection film disposed on the thin film glass substrate, and an adhesive layer bonding the thin film glass substrate and the protection film.

The bezel pattern BM is a colored light-shielding film and may be formed, e.g., through a coating method. The bezel pattern BM may include a base material and a dye or a pigment mixed with the base material. The bezel pattern BM overlaps the non-display region NDA shown in FIG. 1 and the bezel region BA shown in FIG. 2. The bezel pattern BM may be disposed on the lower surface of the base substrate BS. When the base substrate BS has a multilayer structure, the bezel pattern BM may be disposed between interfaces defined by a plurality of layers. In an embodiment, the bezel pattern BM may be disposed between the thin film glass substrate and the protection film, for example. Separately, the window WM may further include at least one of a hard coating layer, an anti-fingerprint layer, or an anti-reflection layer on an upper surface of the base substrate BS.

The upper member UM may include an upper film UF. The upper film UF may include a synthetic resin film. The synthetic resin film may include polyimide, polycarbonate, polyamide, triacetylcellulose, polymethylmethacrylate, or polyethylene terephthalate.

The upper film UF may absorb external shocks applied to a front surface of the display device DD. In an embodiment of the inventive concept, the display module DM may include a color filter that replaces a polarizing film as an anti-reflection member, and accordingly, the display device DD may have reduced front impact strength. As the color filter is applied, the upper film UF may compensate for the reduced impact strength.

The upper film UF overlaps the bezel region BA and the transmission region TA. The upper film UF may overlap only a portion of the bezel region BA. A portion of the bezel pattern BM may be exposed from the upper film UF. In an embodiment of the inventive concept, the upper film UF may be omitted. In an embodiment of the inventive concept, the upper film UF may be replaced with an optical film including a polarizer and a retarder.

The upper member UM may further include a first adhesive layer AL1 bonding the upper film UF and the window WM, and a second adhesive layer AL2 bonding the upper film UF and the display module DM. The first adhesive layer AL1 and the second adhesive layer AL2 may include a pressure sensitive adhesive film ("PSA") or an optically clear adhesive ("OCA"). Adhesive layers which will be described below may also include the same adhesive as the first adhesive layer AL1.

The display module DM is disposed below the upper film UF. The display module DM overlaps the bezel region BA and the transmission region TA. The display module DM may entirely overlap the upper film UF within the bezel region BA. A side surface of the display module DM may be aligned with a side surface of the upper film UF, and a corner of the display module DM may be aligned with a corner of the upper film UF in a plan view.

In the bezel region BA, the pad region PA may overlap the upper film UF. A portion of the display module DM corresponding to the pad region PA may be bonded to a lower surface of the upper film UF through the second adhesive layer AL2. The pad region PA overlaps the upper film UF, and a portion of the display module DM overlapping the pad region PA is bonded to the upper film UF, and accordingly, the upper film UF may sufficiently support the pad region PA when the flexible printed circuit board FCB is bonded to the pad region PA.

The lower member LM may include a lower film PF, a cover panel CP, a third adhesive layer AL3, and a fourth adhesive layer AL4. In an embodiment of the inventive concept, the lower member LM may further include a support plate and a digitizer.

The lower film PF may be disposed below the display module DM, and may be bonded to a lower surface of the display module DM through the third adhesive layer AL3. The lower film PF may protect a lower portion of the display module DM. The lower film PF may include a flexible synthetic resin film. In an embodiment, the lower film PF may include polyethylene terephthalate or polyimide, for example, but is not limited thereto.

The lower film PF exposes at least the pad region PA. The lower film PF may have a smaller area than the display module DM. In an embodiment, the lower film PF may overlap only the display region DA, for example.

The lower film PF may have substantially the same area as the display module DM. An open region PF-OP corresponding to the pad region PA (refer to FIG. 2) may be defined in the lower film PF. The open region PF-OP is defined such that the flexible printed circuit board FCB approaches the pad region PA even when the lower film PF protects the lower surface of the display module DM as a whole.

As shown in FIG. 3, the fourth adhesive layer AL4 bonds the lower film PF and the cover panel CP. The cover panel CP may increase resistance against compressive force caused by external pressing. Accordingly, the cover panel CP may serve to prevent deformation of the display panel DP. The cover panel CP may include a flexible plastic material such as polyimide or polyethylene terephthalate. In addition, the cover panel CP may be a colored film having relatively low light transmittance. The cover panel CP may absorb light incident from the outside. In an embodiment, the cover panel CP may be a black synthetic resin film, for example. When the display device DD is viewed from an upper side of the window WM, components disposed below the cover panel CP may not be viewed by users.

A support plate may be further disposed below the cover panel CP. The support plate may include a metal material having relatively high strength. The support plate may include reinforcing fiber composite materials. The support plate may include reinforcing fibers disposed inside a matrix portion. The reinforcing fibers may be carbon fibers or glass fibers. The matrix portion may include a polymer resin. The matrix portion may include a thermoplastic resin. In an embodiment, the matrix portion may include a polyamide-based resin or a polypropylene-based resin, for example. In an embodiment, the reinforcing fiber composite materials may be carbon fiber reinforced plastic ("CFRP") or glass fiber reinforced plastic ("GFRP"), for example.

Figure 4:
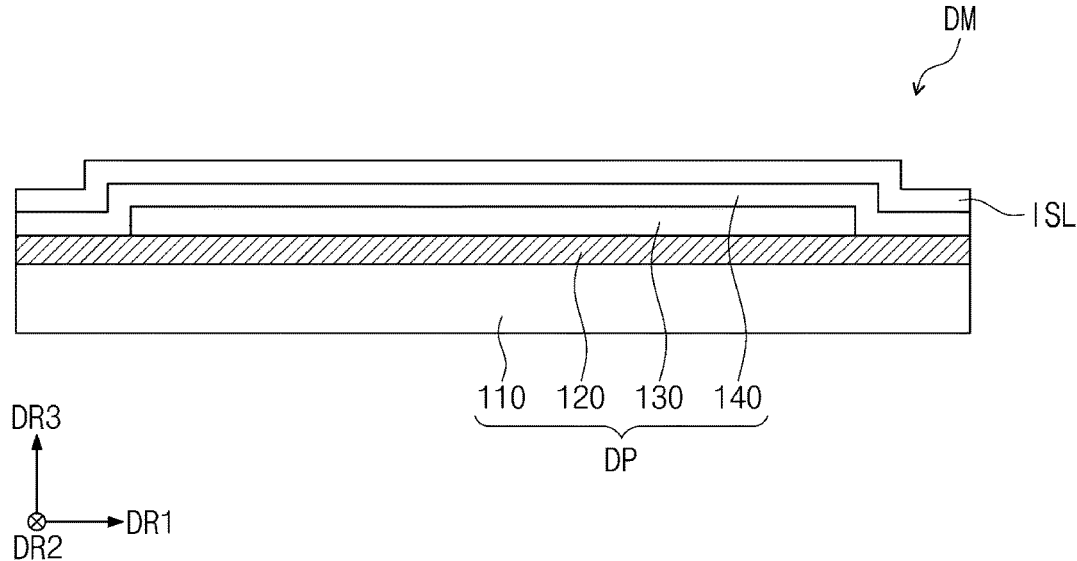
FIG. 4 is a brief cross-sectional view of an embodiment of a display module according to the inventive concept.

FIG. 4 is a brief cross-sectional view of an embodiment of a display module DM according to the inventive concept.

Referring to FIG. 4, the display module DM may include a display panel DP and an input sensor ISL. The display panel DP may include a base layer 110, a driving element layer 120, a light-emitting element layer 130, and an encapsulation layer 140.

The driving element layer 120 is disposed on an upper surface of the base layer 110. The base layer 110 may be a flexible substrate that is bendable, foldable, rollable, or the like. The base layer 110 may be a glass substrate, a metal substrate, or a polymer substrate. However, the inventive concept is not limited thereto, and the base layer 110 may be an inorganic layer, an organic layer, or a composite material layer. The base layer 110 has substantially the same shape as that of the display panel DP.

The base layer 110 may have a multilayer structure. In an embodiment, the base layer 110 may include a first synthetic resin layer, a second synthetic resin layer, and inorganic layers disposed therebetween, for example. The first and second synthetic resin layers each may include a polyimide-based resin, and is not particularly limited.

The driving element layer 120 may be disposed on the base layer 110. The driving element layer 120 may include a plurality of insulating layers, a plurality of semiconductor patterns, a plurality of conductive patterns, signal lines, or the like. The driving element layer 120 may include a driving circuit of a pixel. Hereinafter, unless otherwise specified, when components A and B are disposed in the same layer, they are interpreted to be formed through the same process and to have the same materials or the same stack structure. Conductive patterns or semiconductor patterns disposed in the same layer may be interpreted as described above.

The light-emitting element layer 130 may be disposed on the driving element layer 120. The light-emitting element layer 130 may include a light-emitting element. In an embodiment, the light-emitting element may include organic light-emitting materials, inorganic light-emitting materials, organic-inorganic light-emitting materials, quantum dots, quantum rods, micro light-emitting diodes ("LEDs"), or nano LEDs, for example.

The encapsulation layer 140 may be disposed on the light-emitting element layer 130. The encapsulation layer 140 may serve to protect the light-emitting element layer 130, that is a light-emitting element, from moisture, oxygen, and foreign substances such as dust particles. The encapsulation layer 140 may include at least one inorganic encapsulation layer. The encapsulation layer 140 may include a stack structure of a first inorganic encapsulation layer/an organic encapsulation layer/a second inorganic encapsulation layer.

The input sensor ISL may be directly disposed on the display panel DP. The input sensor ISL may detect user inputs using, e.g., an electromagnetic induction method or a capacitive method. The display panel DP and the input sensor ISL may be formed through a roll-to-roll process. The term "being directly disposed" as described herein may indicate that a third component is not disposed between the input sensor ISL and the display panel DP. In an embodiment, a separate adhesive layer may not be disposed between the input sensor ISL and the display panel DP, for example.

Figure 5:
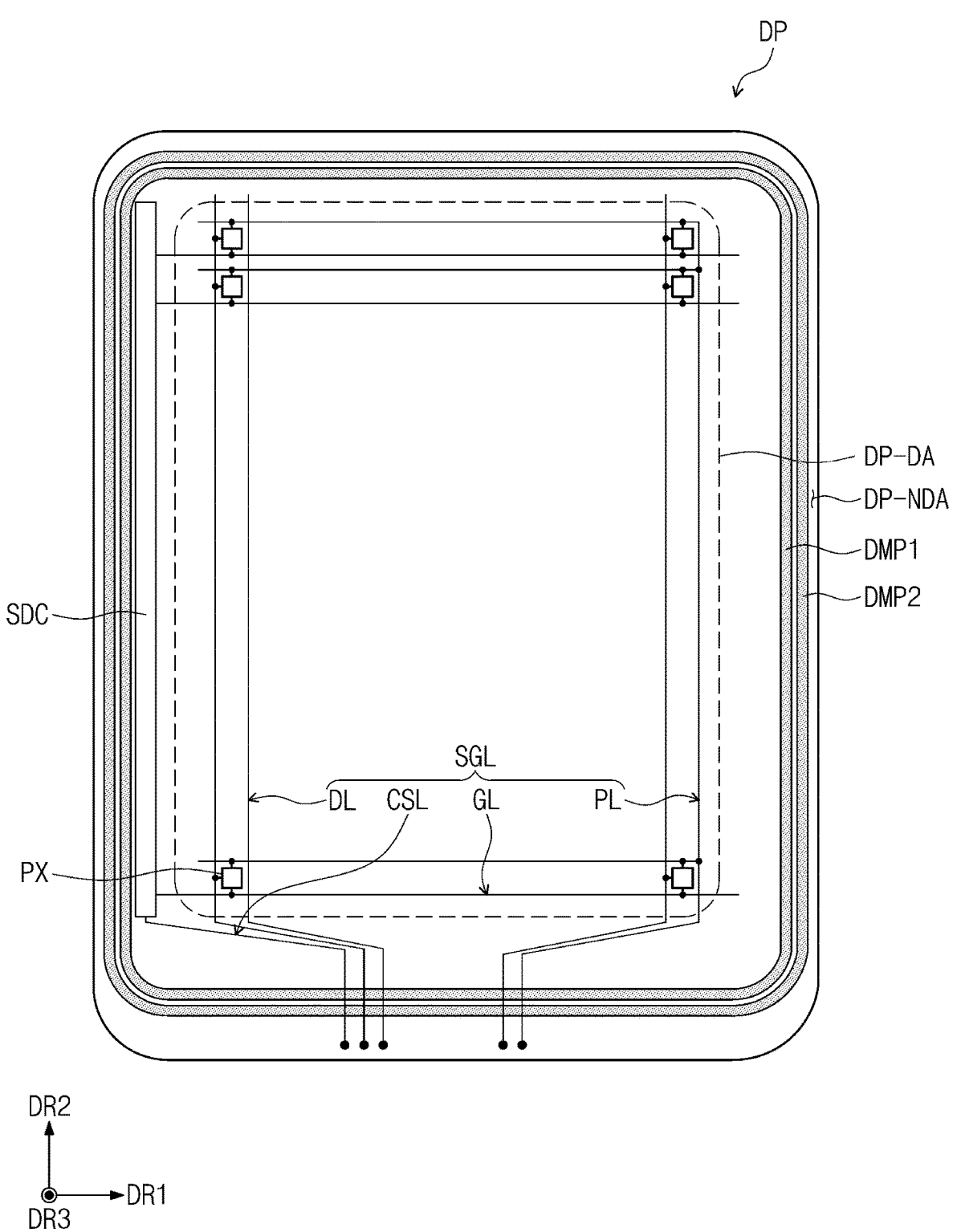
FIG. 5 is a plan view of an embodiment of a display panel according to the inventive concept.
Figure 6:
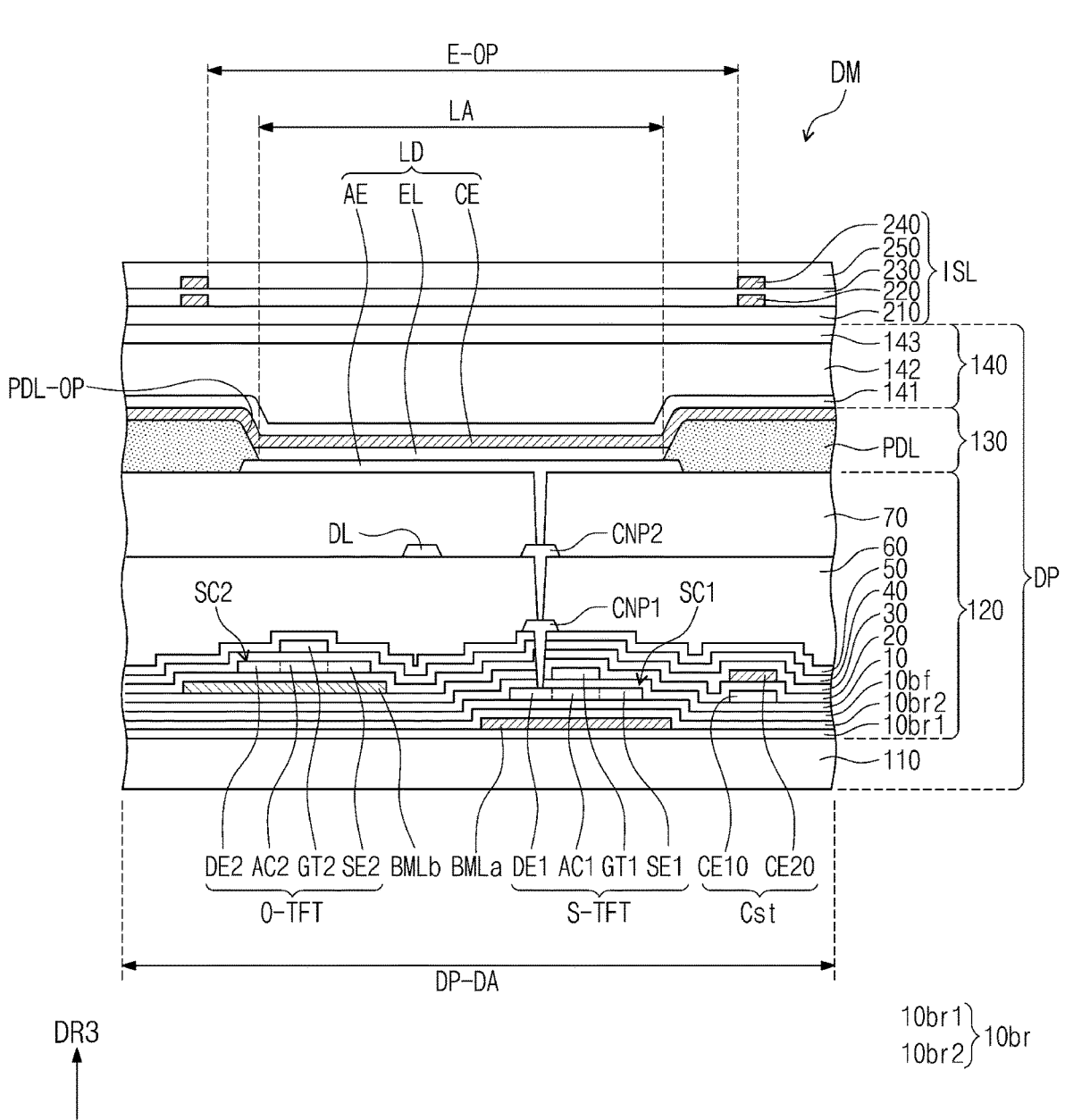
FIG. 6 is a detailed cross-sectional view of an embodiment of a display module according to the inventive concept.

FIG. 5 is a plan view of an embodiment of a display panel DP according to the inventive concept. FIG. 6 is a cross-sectional view of an embodiment of a display module DM according to the inventive concept.

As shown in FIG. 5, the display panel DP may include a scan driving circuit SDC, a plurality of signal lines SGL, and a plurality of pixels PX. The plurality of pixels PX are disposed in the display region DP-DA. Each of the pixels PX includes a light-emitting element and a pixel driving circuit connected thereto. The scan driving circuit SDC, the plurality of signal lines SGL, and the pixel driving circuit may be included in the driving element layer 120 shown in FIG. 4.

The scan driving circuit SDC may include a gate driving circuit. The gate driving circuit generates a plurality of scan signals and sequentially outputs the plurality of scan signals to a plurality of scan lines GL, which will be described later. The scan driving circuit SDC may further include a light-emitting driving circuit that is distinct from the gate driving circuit. The light-emitting driving circuit may output scan signals to another group of scan lines.

The scan driving circuit SDC may include a plurality of thin film transistors formed through the same process as the pixel driving circuit, e.g., a low temperature polycrystalline silicon ("LTPS") process or a low temperature polycrystalline oxide ("LTPO") process.

The plurality of signal lines SGL include scan lines GL, data lines DL, power line PL, and control signal line CSL. Each of the scan lines GL is connected to a corresponding pixel PX among the plurality of pixels PX, and each of the data lines DL is connected to a corresponding pixel PX among the plurality of pixels PX. The power line PL is connected to the plurality of pixels PX. The data lines DL provide data signals to the pixels PX. The control signal line CSL may provide control signals to the scan driving circuit SDC.

Figure 8:
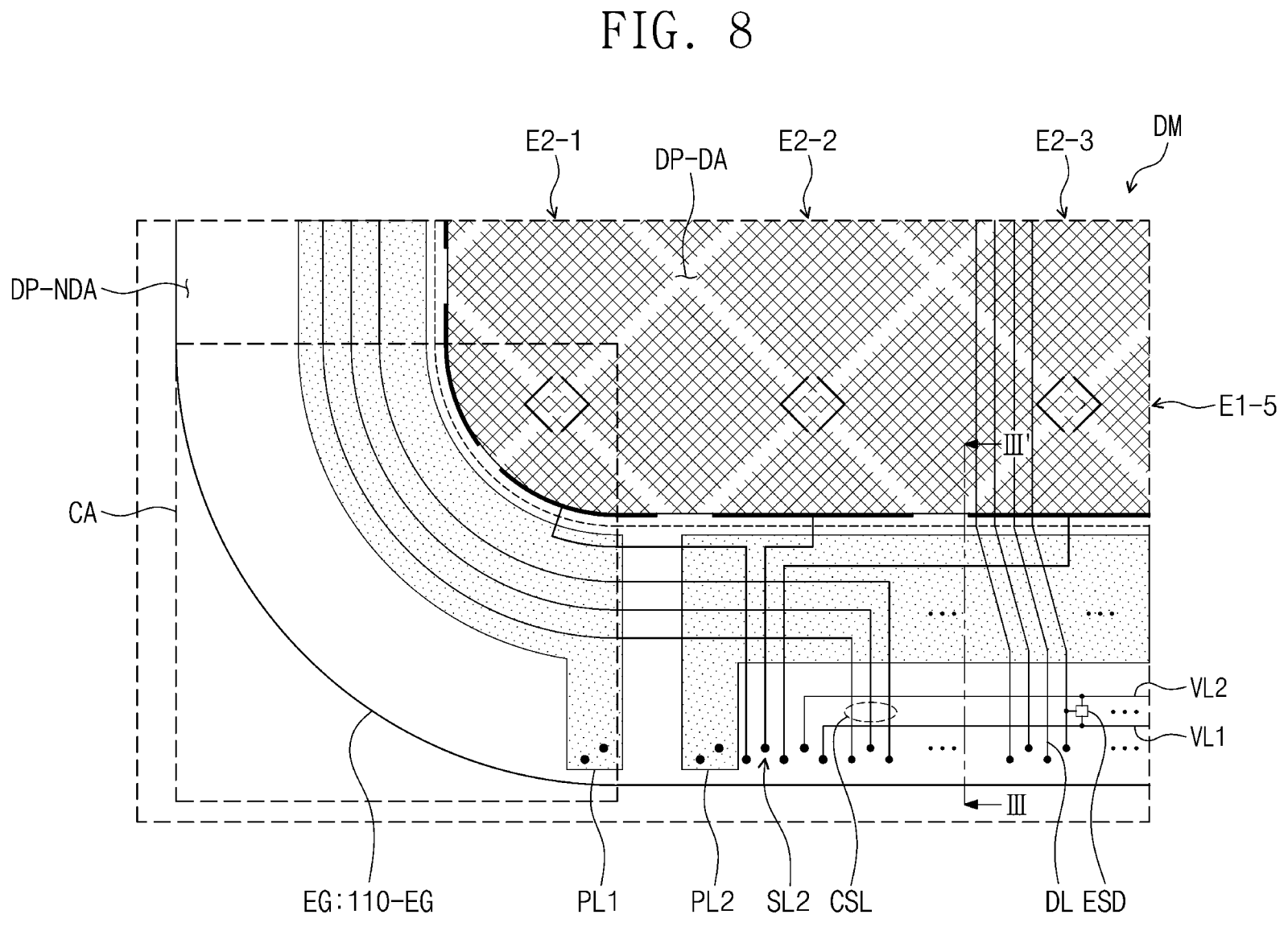

As shown in FIG. 8, the power line PL may include a first power line PL1 receiving a first power voltage, and a second power line PL2 receiving a second power voltage at a higher level than the first power voltage. The first power voltage is provided to the pixels PX through the first power line PL1, and the second power voltage is provided to the pixels PX through the second power line PL2. Although one control signal line CSL is shown in an embodiment, a plurality of control signal lines CSL may be provided.

The scan lines GL, the data lines DL, and the power line PL may overlap the display region DP-DA and the non-display region DP-NDA, and the control signal line CSL may overlap the non-display region DP-NDA. Ends of the plurality of signal lines SGL may be aligned at one side of the non-display region DP-NDA. Each of the plurality of signal lines SGL may have a single body shape, but may include a plurality of portions disposed in different layers. Different portions separated by an insulating layer may be connected through contact holes passing through the insulating layer. In an embodiment, the data lines DL may include a first portion disposed in the display region DP-DA, and a second portion disposed in the non-display region DP-NDA and disposed in a different layer from the first portion, for example. The first portion and the second portion may include different materials and may have different stack structures.

The display panel DP may include insulating patterns DMP1 and DMP2. FIG. 5 shows first and second insulating patterns DMP1 and DMP2 as one of embodiments. The first and second insulating patterns DMP1 and DMP2 are disposed in the non-display region DP-NDA and surround the display region DP-DA. Each of the first and second insulating patterns DMP1 and DMP2 may have a closed line shape. The first and second insulating patterns DMP1 and DMP2 serve as a dam to prevent a liquid organic material from overflowing in an inkjet process of the display panel DP. Detailed descriptions thereof will be given later.

FIG. 6 shows a cross section of the display module DM corresponding to the pixel PX of FIG. 5.

The pixel driving circuit driving a light-emitting element LD may include a plurality of pixel driving elements. The pixel driving circuit may include a plurality of transistors and a capacitor Cst. FIG. 6 shows a silicon transistor S-TFT and an oxide transistor O-TFT. The pixel driving circuit of FIG. 6 is merely one of embodiments, and the components of the pixel driving circuit are not necessarily limited thereto. The pixel driving circuit may include only one type of transistor from the silicon transistor S-TFT and the oxide transistor O-TFT.

Referring to FIG. 6, the base layer 110 is shown as a single layer. The base layer 110 may include a synthetic resin such as polyimide. A synthetic resin layer may be applied onto a working substrate to form the base layer 110. When the display module DM is completed through subsequent processes, the working substrate may be removed.

Referring to FIG. 6, a barrier layer 10br may be disposed on the base layer 110. The barrier layer 10br prevents foreign substances from being introduced from the outside. The barrier layer 10br may include at least one inorganic layer. The barrier layer 10br may include a silicon oxide layer and a silicon nitride layer. Each of these may be provided in plural, and silicon oxide layers and silicon nitride layers may be alternately stacked.

The barrier layer 10br may include a lower barrier layer 10br1 and an upper barrier layer 10br2. A first shielding electrode BMLa may be disposed between the lower barrier layer 10br1 and the upper barrier layer 10br2. The first shielding electrode BMLa may be disposed to correspond to the silicon transistor S-TFT. The first shielding electrode BMLa may include metal.

The first shielding electrode BMLa may receive a bias voltage. The first shielding electrode BMLa may receive the first power voltage. The first shielding electrode BMLa may block an electric potential caused by a polarization phenomenon from affecting the silicon transistor S-TFT. The first shielding electrode BMLa may block external light from reaching the silicon transistor S-TFT. In an embodiment of the inventive concept, the first shielding electrode BMLa may be a floating electrode in a form isolated from other electrodes or wires.

A buffer layer 10*bf* may be disposed on the barrier layer 10*br*. The buffer layer 10*bf* may prevent metal atoms or impurities from the base layer 110 from being diffused into a first semiconductor pattern SC1 at an upper side. The buffer layer 10*bf* may include at least one inorganic layer. The buffer layer 10*bf* may include a silicon oxide layer and a silicon nitride layer.

The first semiconductor pattern SC1 may be disposed on the buffer layer 10*bf*. The first semiconductor pattern SC1 may include a silicon semiconductor. In an embodiment, the silicon semiconductor may include amorphous silicon, polycrystalline silicon, or the like, for example. In an embodiment, the first semiconductor pattern SC1 may include low-temperature polysilicon, for example.

The first semiconductor pattern SC1 may have different electrical properties according to with/without doping. The first semiconductor pattern SC1 may include a first region having relatively high conductivity and a second region having relatively low conductivity. The first region may be doped with an N-type dopant or a P-type dopant. A P-type transistor may include a doped region doped with the P-type dopant, and a N-type transistor may include a doped region doped with the N-type dopant. The second region may be a non-doped region or may be doped in a lower concentration than the first region. In the illustrated embodiment, the first semiconductor pattern SC1 may be an N-type transistor.

A first region has greater conductivity than a second region, and may substantially serve as an electrode or a signal line. The second region may substantially correspond to a channel region (or an active region) of the transistor. That is, a portion of the first semiconductor pattern SC1 may be a channel of the transistor, another portion may be a source or drain of the transistor, and the other portion may be a connection electrode or a connection signal line.

A source region SE1, a channel region AC1 (or an active region), and a drain region DE1 of the silicon transistor S-TFT may be formed from the first semiconductor pattern SC1. The source region SE1 and the drain region DE1 may extend in opposite directions from the channel region AC1 on a cross section.

A first insulating layer 10 may be disposed on the buffer layer 10*bf*. The first insulating layer 10 may cover the first semiconductor pattern SC1. The first insulating layer 10 may be an inorganic layer. The first insulating layer 10 may be a single-layered silicon oxide layer. The first insulating layer 10 as well as an inorganic layer of the driving element layer 120, which will be described later may have a single-layer or multi-layer structure, and may include at least one of the above materials, but the inventive concept is not limited thereto.

A gate GT1 of the silicon transistor S-TFT is disposed on the first insulating layer 10. The gate GT1 may be a portion of a metal pattern. The gate GT1 overlaps the channel region AC1. In the process of doping the first semiconductor pattern SC1, the gate GT1 may be a mask. A first electrode CE10 of a storage capacitor Cst is disposed on the first insulating layer 10. Unlike what is shown in FIG. 6, the first electrode CE10 may have a single body shape with the gate GT1.

A second insulating layer 20 may be disposed on the first insulating layer 10 and may cover the gate GT1. In an embodiment of the inventive concept, an upper electrode overlapping the gate GT1 may be further disposed on the second insulating layer 20. A second electrode CE20 overlapping the first electrode CE10 may be disposed on the second insulating layer 20. The upper electrode may have a single body shape with the second electrode CE20 in a plan view.

A second shielding electrode BMLb is disposed on the second insulating layer 20. The second shielding electrode BMLb may be disposed to correspond to the oxide transistor O-TFT. In an embodiment of the inventive concept, the second shielding electrode BMLb may be omitted. In an embodiment of the inventive concept, the first shielding electrode BMLa may extend to a bottom of the oxide transistor O-TFT, thereby replacing the second shielding electrode BMLb.

A third insulating layer 30 may be disposed on the second insulating layer 20. A second semiconductor pattern SC2 may be disposed on the third insulating layer 30. The second semiconductor pattern SC2 may include the channel region AC2 of the oxide transistor O-TFT. The second semiconductor pattern SC2 may include an oxide semiconductor. The second semiconductor pattern SC2 may include a transparent conductive oxide ("TCO") such as indium tin oxide ("ITO"), indium zinc oxide ("IZO"), indium gallium zinc oxide ("IGZO"), zinc oxide ($ZnO_x$), indium oxide (In2O3), or the like.

The oxide semiconductor may include a plurality of regions SE2, AC2, and DE2 divided according to whether transparent conductive oxides are reduced. A region in which the transparent conductive oxide is reduced (hereinafter, reduction region) has greater conductivity than a region in which the transparent conductive oxide is not reduced (hereinafter, non-reduction region). The reduction region substantially serves as a source/drain or signal line of transistors. The non-reduction region substantially corresponds to a semiconductor region (or a channel) of transistors. That is, a portion of the second semiconductor pattern SC2 may be a semiconductor region of transistors, another partial region may be a source region SE2/drain region DE2 of transistors, and the other region may be a signal transmission region.

A fourth insulating layer 40 may be disposed on the third insulating layer 30. As shown in FIG. 6, the fourth insulating layer 40 may cover the second semiconductor pattern SC2. In an embodiment of the inventive concept, the fourth insulating layer 40 may be an insulation pattern overlapping the gate GT2 of the oxide transistor O-TFT and expose the source region SE2 and the drain region DE2 of the oxide transistor O-TFT.

A gate GT2 of the oxide transistor O-TFT is disposed on the fourth insulating layer 40. The gate GT2 of the oxide transistor O-TFT may be a portion of a metal pattern. The gate GT2 of the oxide transistor O-TFT overlaps the channel region AC2.

A fifth insulating layer 50 may be disposed on the fourth insulating layer 40, and the fifth insulating layer 50 may cover the gate GT2. Each of the first insulating layer 10 to the fifth insulating layer 50 may be an inorganic layer.

A first connection pattern CNP1 may be disposed on the fifth insulating layer 50. The first connection pattern CNP1 may be connected to drain region DE1 of the silicon transistor S-TFT through a contact hole passing through the first to fifth insulating layers 10, 20, 30, 40, and 50.

A sixth insulating layer 60 may be disposed on the fifth insulating layer 50. A second connection pattern CNP2 may be disposed on the sixth insulating layer 60. The second connection pattern CNP2 may be connected to the first connection pattern CNP1 through a contact hole passing through the sixth insulating layer 60. A data line DL may be disposed on the sixth insulating layer 60. A seventh insulating layer 70 is disposed on the sixth insulating layer 60 and may cover the second connection pattern CNP2 and the data line DL. The second connection pattern CNP2 and the data line DL are formed through the same process, and may thus have the same material and the same stack structure. Each of the sixth insulating layer 60 and the seventh insulating layer 70 may be an organic layer.

The first shielding electrode BMLa, the gate GT1 of the silicon transistor S-TFT, the second electrode CE20, and the gate GT2 of the oxide transistor O-TFT may include molybdenum (Mo) having satisfactory heat resistance, an alloy including or consisting of molybdenum, titanium (Ti), or an alloy including or consisting of titanium. The first connection pattern CNP1 and the second connection pattern CNP2 may include aluminum having relatively high electrical conductivity. The first connection pattern CNP1 and the second connection pattern CNP2 may have a three-layered structure in which titanium/aluminum/titanium are stacked.

The light-emitting element LD may include an anode AE (or a first electrode), an emission layer EL, and a cathode CE (or a second electrode). The anode AE of the light-emitting element LD may be disposed on the seventh insulating layer 70. The anode AE may be a (semi-)transmissive electrode or a reflective electrode. The anode AE may include a stack structure in which ITO/Ag/ITO are sequentially stacked. Positions of the anode AE and the cathode CE may be interchanged.

The pixel defining film PDL may be disposed on the seventh insulating layer 70. The pixel defining film PDL may be an organic layer. The pixel defining film PDL may have light absorption properties, and for example, the pixel defining film PDL may be black in color. The pixel defining film PDL may include a black coloring agent. The black coloring agent may include a black dye and a black pigment. The black coloring agent may include carbon black, a metal such as chromium, or an oxide thereof. The pixel defining film PDL may correspond to a light-blocking pattern having light-blocking properties.

The pixel defining film PDL may cover a portion of the anode AE. In an embodiment, an opening PDL-OP exposing a portion of the anode AE may be defined in the pixel defining film PDL, for example. A light-emitting region LA may be defined to correspond to the opening PDL-OP. In an embodiment of the inventive concept, a hole control layer may be disposed between the anode AE and the emission layer EL. The hole control layer may include a hole transport layer, and may further include a hole injection layer. An electron control layer may be disposed between the emission layer EL and the cathode CE. The electron control layer may include an electron transport layer, and may further include an electron injection layer.

The encapsulation layer 140 may cover the light-emitting element LD. The encapsulation layer 140 may include an inorganic encapsulation layer 141, an organic encapsulation layer 142, and an inorganic encapsulation layer 143 which are sequentially stacked, but the layers forming the encapsulation layer 140 are not limited thereto. The inorganic encapsulation layers 141 and 143 may include a silicon nitride layer, a silicon oxy nitride layer, a silicon oxide layer, a titanium oxide layer, or an aluminum oxide layer. Each of the inorganic encapsulation layers 141 and 143 may have a multi-layer structure. The organic encapsulation layer 142 may include an acryl-based organic layer, but the inventive concept is not limited thereto.

The input sensor ISL may include at least one conductive layer (or at least one sensor conductive layer) and at least one insulating layer (or at least one sensor insulating layer). In the illustrated embodiment, the input sensor ISL may include a first insulating layer 210 (or a first sensor insulating layer), a first conductive layer 220, a second insulating layer 230 (or a second sensor insulating layer), a second conductive layer 240, and a third insulating layer 250 (or a third sensor insulating layer). FIG. 6 shows conductive lines of the first conductive layer 220 and conductive lines of the second conductive layer 240.

The first insulating layer 210 may be directly disposed on the display panel DP. The first insulating layer 210 may be an inorganic layer including at least any one of silicon nitride, silicon oxynitride, or silicon oxide. The first conductive layer 220 and the second conductive layer 240 each may have a single-layer structure or may have a multi-layer structure stacked along the third direction DR3. The first conductive layer 220 and the second conductive layer 240 may include conductive lines that define an electrode in the form of a mesh. The conductive line of the first conductive layer 220 and the conductive line of the second conductive layer 240 may be connected through a contact hole passing through the second insulating layer 230 or may not be connected. A connection relationship between the conductive line of the first conductive layer 220 and the conductive line of the second conductive layer 240 may be determined according to the type of sensor formed as the input sensor ISL.

The first conductive layer 220 and the second conductive layer 240 having a single-layer structure may include a metal layer or a transparent conductive layer. The metal layer may include molybdenum, silver, titanium, copper, aluminum, or any alloys thereof. The transparent conductive layer may include a transparent conductive oxide such as indium tin oxide ("ITO"), indium zinc oxide ("IZO"), zinc oxide (ZnOx), or indium zinc tin oxide ("IZTO"). In addition, the transparent conductive layer may include a conductive polymer such as poly(3,4-ethylenedioxythiophene) ("PEDOT"), a metal nanowire, graphene, or the like.

The first conductive layer 220 and the second conductive layer 240 of the multi-layer structure may include metal layers. The metal layers may have a three-layer structure of, e.g., titanium/aluminum/titanium. The multi-layered conductive layer may include at least one metal layer and at least one transparent conductive layer. The second insulating layer 230 may be disposed between the first conductive layer 220 and the second conductive layer 240. The third insulating layer 250 may cover the second conductive layer 240. In an embodiment of the inventive concept, the third insulating layer 250 may be omitted. The second insulating layer 230 and the third insulating layer 250 may include an inorganic layer or an organic layer.

Figure 7A:
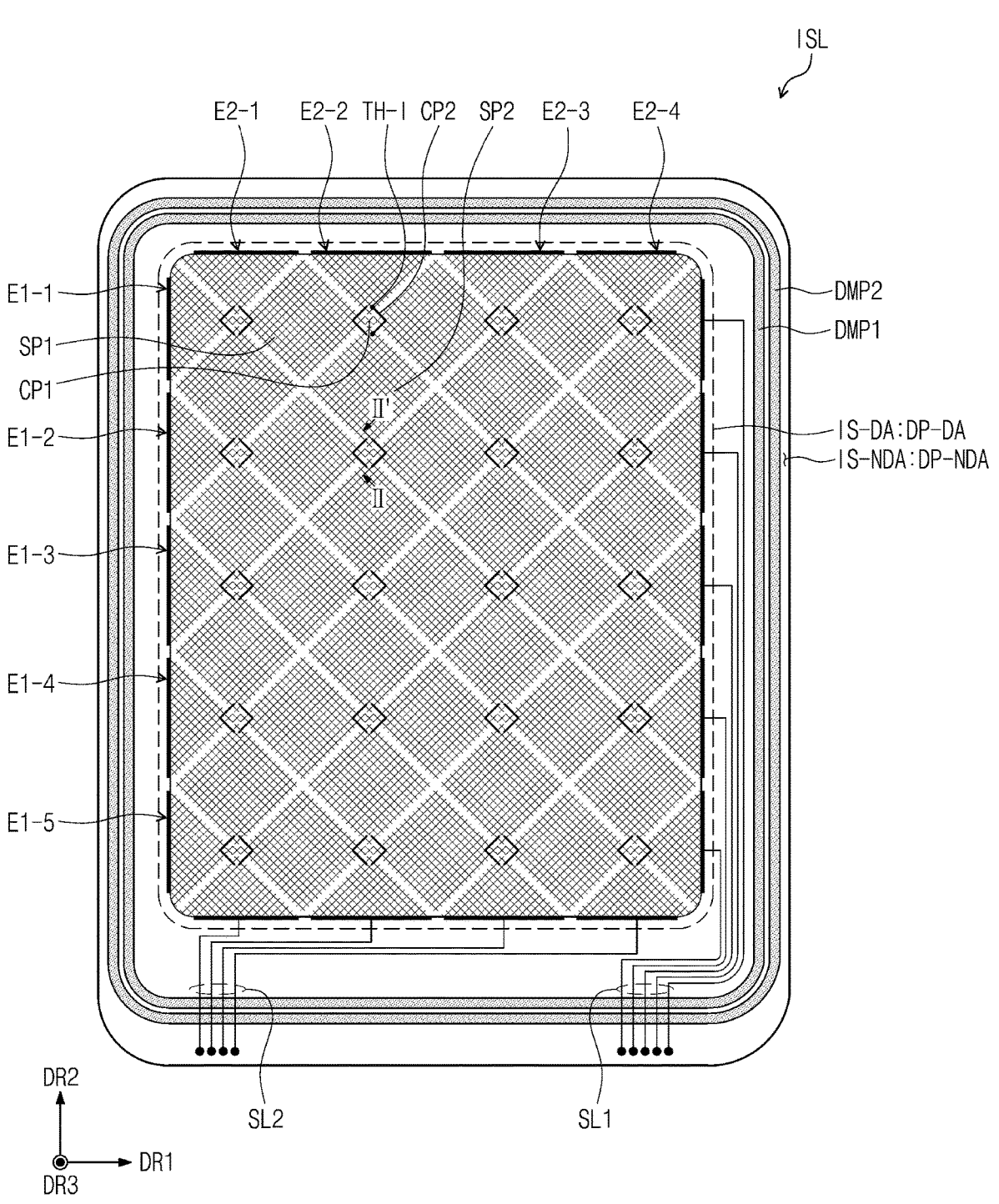
FIG. 7A is a plan view of an embodiment of an input sensor according to the inventive concept.
Figure 7B:
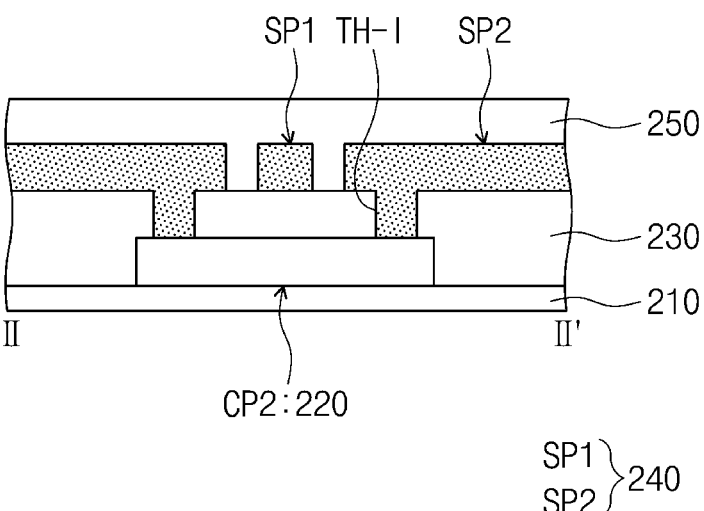
FIG. 7B is a cross-sectional view of an input sensor corresponding to II-II' of FIG. 7.

FIG. 7A is a plan view of an embodiment of an input sensor ISL according to the inventive concept. FIG. 7B is a cross-sectional view of an input sensor ISL corresponding to II-II' of FIG. 7.

As shown in FIG. 7A, the input sensor ISL includes a sensing region IS-DA and a non-sensing region IS-NDA adjacent to the sensing region IS-DA. The sensing region IS-DA and the non-sensing region IS-NDA respectively correspond to the display region DP-DA and the non-display region DP-NDA shown in FIG. 5. The input sensor ISL includes first electrodes E1-1 to E1-5 (or first sensing electrodes), second electrodes E2-1 to E2-4 (or second sensing electrodes), first signal lines SL1 (or first sensor signal lines), and second signal lines SL2 (or second sensor signal lines). The first and second insulating patterns DMP1 and DMP2 are additionally shown in FIG. 7A to indicate the relative positions of the first and second insulating patterns DMP1 and DMP2 with respect to the input sensor ISL.

The first electrodes E1-1 to E1-5 and the second electrodes E2-1 to E2-4 that insulatively cross each other are disposed in the sensing region IS-DA. First signal lines SL1 connected to the first electrodes E1-1 to E1-5 and second signal lines SL2 electrically connected to the second electrodes E2-1 to E2-4 are disposed in the non-sensing region IS-NDA. Any one of the first signal lines SL1 and the second signal lines SL2 transmits driving signals for sensing external inputs from an external circuit to corresponding electrodes, and the other one outputs sensing signals. Changes in capacitance between the first electrodes E1-1 to E1-5 and the second electrodes E2-1 to E2-4 are measured based on the sensing signals. In the illustrated embodiment, a mutual-cap type input sensor is shown in an embodiment, but the inventive concept is not limited thereto. A self-cap type input sensor may be applied. The self-cap type input sensor may include one type of sensing electrodes.

Each of the first electrodes E1-1 to E1-5 and the second electrodes E2-1 to E2-4 may be in the form of a mesh in which a plurality of openings are defined. The plurality of openings may be defined to correspond to the light-emitting region LA (refer to FIG. 6) of the display panel DP. FIG. 6 shows an opening E-OP corresponding to one light-emitting region. The second electrodes E2-1 to E2-4 insulatively cross the first electrodes E1-1 to E1-5. Any one of the first electrodes E1-1 to E1-5 and the second electrodes E2-1 to E2-4 may have a single body shape. In the illustrated embodiment, the first electrodes E1-1 to E1-5 having a single body shape are presented as one of embodiments. The first electrodes E1-1 to E1-5 may include sensing portions SP1 and intermediate portions CP1.

Each of the second electrodes E2-1 to E2-4 may include sensing patterns SP2 and bridge patterns CP2 (or connection patterns). Two adjacent sensing patterns SP2 may be connected through two bridge patterns CP2, but the number of bridge patterns is not limited.

Referring to FIGS. 6 to 7B, the bridge patterns CP2 may be formed from the first conductive layer 220, and the plurality of first electrodes E1-1 to E1-5 and the sensing patterns SP2 may be formed from the second conductive layer 240. The bridge pattern CP2 may be connected to the sensing patterns SP2 through a contact hole TH-I defined in the second insulating layer 230.

In the illustrated embodiment, each of the first signal lines SL1 and the second signal lines SL2 of FIG. 7A may be formed from the first conductive layer 220 of FIG. 6. Accordingly, each of the first signal lines SL1 and the second signal lines SL2 of FIG. 7A may be disposed in the same layer as the bridge pattern CP2 of FIG. 7B. However, the inventive concept is not limited thereto, and each of the first signal lines SL1 and the second signal lines SL2 may be formed from the second conductive layer 240. Each of the first signal lines SL1 and the second signal lines SL2 may include both a line formed from the first conductive layer 220 and a line formed from the second conductive layer 240.

Figure 9A:
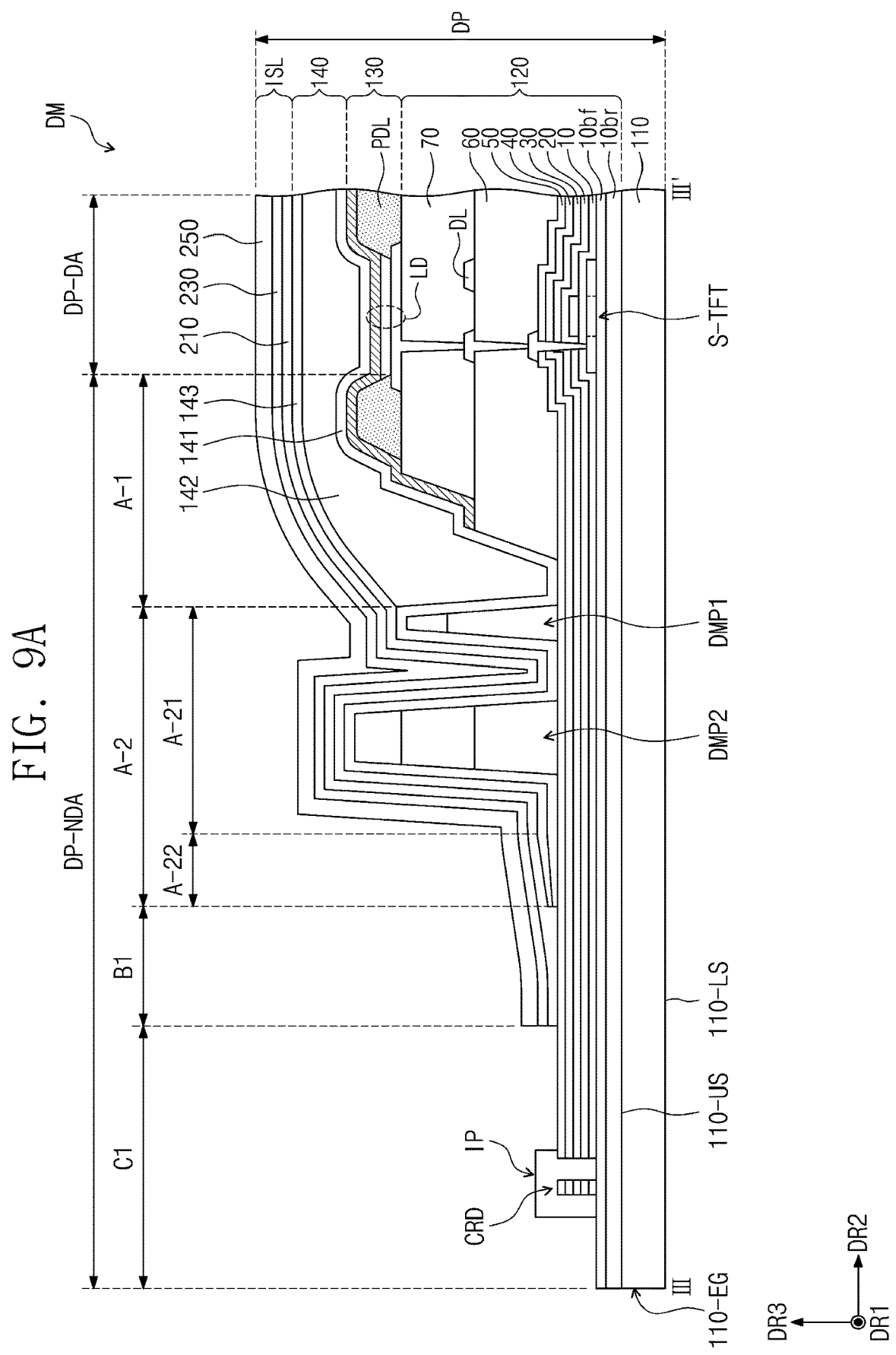
FIG. 9A is a cross-sectional view of a display module corresponding to III-III' of FIG. 8.
Figure 9B:
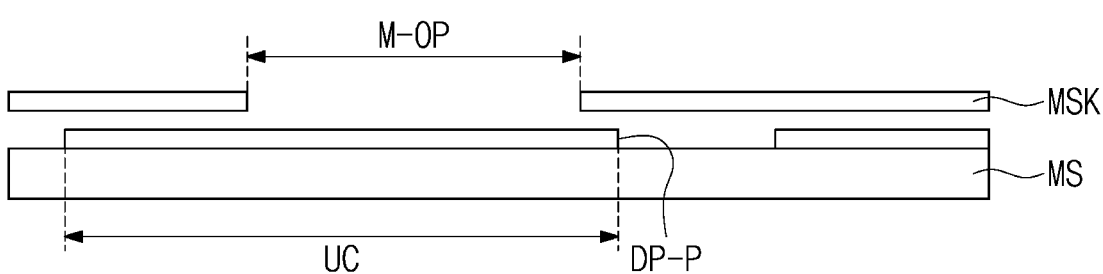
FIG. 9B is a cross-sectional view showing an embodiment of a deposition process according to the inventive concept.
Figure 9C:
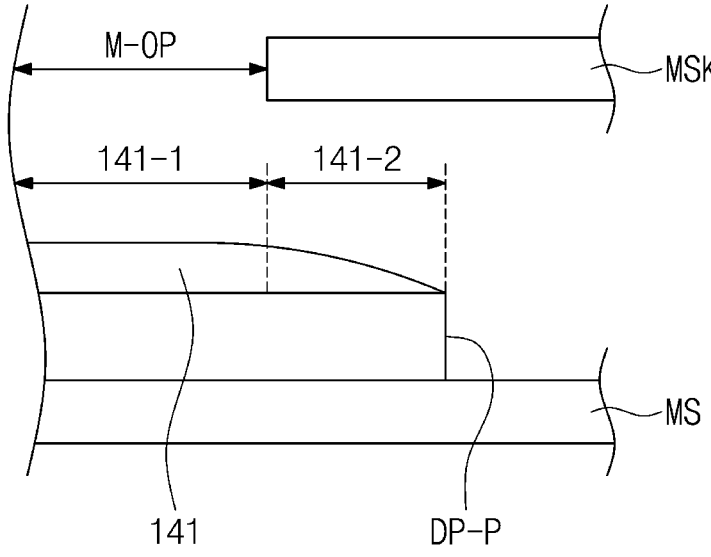
FIG. 9C is a cross-sectional view enlarging a portion of FIG. 9B.

FIG. 8 is a plan view enlarging an embodiment of a non-display region DP-NDA of a display module DM according to the inventive concept. FIG. 9A is a cross-sectional view of a display module DM corresponding to III-III' of FIG. 8. FIG. 9B is a cross-sectional view showing an embodiment of a deposition process according to the inventive concept. FIG. 9C is a cross-sectional view enlarging a portion of FIG. 9B.

In FIGS. 8 and 9A, the reference numerals used in the display region DP-DA and the non-display region DP-NDA of the display panel DP of FIG. 5 may also apply to the display region DP-DA and the non-display region DP-NDA of the display module DM. In addition, the display region DP-DA and the non-display region DP-NDA may respectively correspond to the sensing region IS-DA and the non-sensing region IS-NDA of FIG. 7A. In the display region DP-DA of FIG. 8, some electrodes E1-5 among the first electrodes E1-1 to E1-5 shown in FIG. 7A and some electrodes E2-1 to E2-3 among the second electrodes E2-1 to E2-4 are shown, and the components of the display panel DP in the display region DP-DA are omitted.

FIG. 8 is a view enlarging one corner region CA (or a vertex region) and a portion of a non-display region DP-NDA disposed below the display region DP-DA in a plan view, with respect to FIGS. 5 and 7A. Among a plurality of components shown in FIG. 8, overlapping components are components disposed in different layers.

The first power line PL1 and the second power line PL2 are disposed in the non-display region DP-NDA. The first power line PL1 may extend to the non-display region DP-NDA on the left shown in FIG. 5 through the corner region CA. A border line between the display region DP-DA and the non-display region DP-NDA within the corner region CA may have a substantially curved line in a plan view. In FIG. 8, the border line between the display region DP-DA and the non-display region DP-NDA is shown in dotted line.

The first power line PL1 may pass through the non-display region DP-NDA on the left shown in FIG. 5 and extend to the non-display region DP-NDA on an upper side and the non-display region DP-NDA on the right. The second power line PL2 may be disposed in the non-display region DP-NDA disposed below the display region DP-DA in a plan view and may extend in the first direction DR1. The first power line PL1 and the second power line PL2 may be disposed in the same layer as the second connection pattern CNP2 shown in FIG. 6.

The first voltage line VL1 and the second voltage line VL2 are disposed in the non-display region DP-NDA. Although one first voltage line VL1 and one second voltage line VL2 are shown, the inventive concept is not limited thereto, and a plurality of first voltage lines VL1 and second voltage lines VL2 may be provided. The first voltage line VL1 receives a first voltage VGL (refer to FIG. 10D) and the second voltage line VL2 receives a second voltage VGH higher than the first voltage VGL (refer to FIG. 10D). In an embodiment of the inventive concept, the first voltage VGL may be a first power voltage, and the second voltage VGH may be a second power voltage.

Each of the first voltage line VL1 and the second voltage line VL2 may include a portion extending in the second direction DR2 and a portion extending in the first direction DR1. The first voltage line VL1 and the second voltage line VL2 do not overlap the second power line PL2 and are disposed below the second power line PL2 in a plan view. The first voltage line VL1 and the second voltage line VL2 are disposed close to an edge EG of the display module DM disposed below the second power line PL2 in a plan view. The edge EG of the display module DM may be an edge 110-EG of the base layer 110 shown in FIG. 9A. The first power line PL1 and the second power line PL2 may be disposed in the same layer as the second connection pattern CNP2 shown in FIG. 6, or may be disposed in the same layer as the first connection pattern CNP1.

At least one control signal line CSL is disposed in the non-display region DP-NDA. The control signal line CSL may be connected to the scan driving circuit SDC shown in FIG. 5 through the corner region CA. The control signal line CSL may overlap the first power line PL1. The control signal line CSL may be disposed in the same layer as any one among the first shielding electrode BMLa, the gate GT1 of the silicon transistor S-TFT, the second electrode CE20, and the gate GT2 of the oxide transistor O-TFT shown in FIG. 6.

The data lines DL are disposed in the display region DP-DA and the non-display region DP-NDA. A portion overlapping the display region DP-DA of the data lines DL may be disposed in the same layer as any one of the first connection pattern CNP1 and the second connection pattern CNP2 shown in FIG. 6. A portion overlapping the non-display region DP-NDA of the data lines DL may be disposed in the same layer as any one among the first shielding electrode BMLa, the gate GT1 of the silicon transistor S-TFT, the second electrode CE20, and the gate GT2 of the oxide transistor O-TFT shown in FIG. 6. The portion overlapping the display region DP-DA of the data lines DL and the portion overlapping the non-display region DP-NDA of the data lines DL are connected through contact holes passing through corresponding insulating layers among the insulating layers 10br to 70 shown in FIG. 6.

The data lines DL may cross the first voltage line VL1, the second voltage line VL2, and the second power line PL2. A static electricity protection circuit ESD connected to the data line DL, the first voltage line VL1, and the second voltage line VL2 is disposed in the non-display region DP-NDA. The static electricity protection circuit ESD is disposed adjacent to the first voltage line VL1 and the second voltage line VL2. FIG. 8 shows one static electricity protection circuit ESD in an embodiment, but an electrostatic protection circuit ESD may be connected to each data line DL, and a plurality of static electricity protection circuits ESD may be connected to each data line DL.

The second signal lines SL2 are disposed in the non-display region DP-NDA. The second signal lines SL2 may overlap the control signal line CSL and the first power line PL1 or the second power line PL2. Each of the second signal lines SL2 may be connected to a corresponding electrode among the second electrodes E2-1 to E2-3 disposed in the display region DP-DA.

FIG. 9A shows a cross-sectional structure of the non-display region DP-NDA shown in FIG. 8 in detail.

Structures of the base layer 110, the driving element layer 120, the light-emitting element layer 130, the encapsulation layer 140, and the input sensor ISL disposed in the display region DP-DA are the same as those described with reference to FIG. 6, and thus a detailed description thereof will be omitted. The insulating layers 10br to 70 described with reference to FIG. 6 extend from the display region DP-DA to the non-display region DP-NDA. The pixel defining film PDL also extends from the display region DP-DA to the non-display region DP-NDA.

A first insulating pattern DMP1 and a second insulating pattern DMP2 spaced apart from the sixth insulating layer 60, the seventh insulating layer 70, and the pixel defining film PDL are disposed in the non-display region DP-NDA. The second insulating pattern DMP2 is disposed farther from the pixel defining film PDL than the first insulating pattern DMP1. The first insulating pattern DMP1 and the second insulating pattern DMP2 may have a multi-layer structure. The first insulating pattern DMP1 may have a two-layer structure, and the second insulating pattern DMP2 may have a three-layer structure, but the inventive concept is not limited thereto. The first insulating pattern DMP1 may include a first layer in the same layer as the seventh insulating layer 70 and a second layer in the same layer as the pixel defining film PDL. The second insulating pattern DMP2 may include a first layer in the same layer as the sixth insulating layer 60, a second layer in the same layer as the seventh insulating layer 70, and a third layer in the same layer as the pixel defining film PDL. The first insulating pattern DMP1 corresponds to a dam preventing a liquid organic material from overflowing in the process of forming an organic encapsulation layer 142. The second insulating pattern DMP2 corresponds to a preliminary dam supplementing the first insulating pattern DMP1.

In a plan view, the non-display region DP-NDA disposed below (or outside) the display region DP-DA shown in FIG. 8 may be divided into a plurality of distinct regions from each other based in a cross-sectional structure shown in FIG. 9A. First, the non-display region DP-NDA overlapping the organic encapsulation layer 142 may be defined as an inner region A-1. The inner region A-1 may be defined from the display region DP-DA to a region in which the first insulating pattern DMP1 is disposed.

An outer region A-2 is defined from the inner region A-1 toward the edge 110-EG of the base layer 110. The outer region A-2 corresponds to a region in which the first inorganic encapsulation layer 141 and the second inorganic encapsulation layer 143 are in contact. When the first inorganic encapsulation layer 141 and the second inorganic encapsulation layer 143 are not aligned and thus only any one of the two is disposed on the fifth insulating layer 50, the corresponding region may also be included in the outer region A-2.

The outer region A-2 may include a first outer region A-21 and a second outer region A-22. The first outer region A-21 is disposed between the second outer region A-22 and the inner region A-1. The second outer region A-22 have a smaller thickness than the first inorganic encapsulation layer 141 and the second inorganic encapsulation layer 143 and a lower film density than the first outer region A-21. The first outer region A-21 and the second outer region A-22 correspond to results of a deposition process, which will be described later.

An arrangement relationship between a mask MSK and a working substrate MS in the deposition process is briefly shown in FIGS. 9B and 9C. As shown in FIGS. 9B and 9C, the mask MSK is aligned to the working substrate MS. The opening M-OP may correspond to the display region DP-DA shown in FIG. 5. The opening M-OP may have the same area as the display region DP-DA shown in FIG. 5 or may have a larger area than the display region DP-DA. The working substrate MS with which the mask MSK is aligned is disposed in a deposition chamber, and then an inorganic material is deposited.

A preliminary display panel DP-P shown in FIGS. 9B and 9C has a structure stacked from the base layer 110 to the light-emitting element layer 130 in FIG. 6. The mask MSK is slightly spaced apart from the preliminary display panel DP-P, and thus an inorganic material is deposited on a larger area than the opening M-OP. Accordingly, the inorganic material is deposited in the display region DP-DA as well as in the non-display region DP-NDA in FIG. 9A. Accordingly, the inner region A-1 and the outer region A-2 described with reference to FIG. 9A are formed.

As shown in FIG. 9C, a first region 141-1 of the first inorganic encapsulation layer 141 is a region that overlaps the opening M-OP, and thus has a substantially uniform thickness. A second region 141-2 of the first inorganic encapsulation layer 141 is a region that overlaps the mask MSK to have a relatively small amount of deposited inorganic material, and thus have a smaller thickness than that of the first region 141-1 of the first inorganic encapsulation layer 141. The thickness of the second region 141-2 decreases as a distance from the first region 141-1 increases. In addition, the second region 141-2 has a lower density than the first region 141-1. This is because ashing gases used to remove organic residues before depositing an inorganic encapsulation layer, such as N2O, are present around the mask MSK to disturb deposition.

The first region 141-1 of FIG. 9C corresponds to a region overlapping the display region DP-DA of the first inorganic encapsulation layer 141, the inner region A-1, and the first outer region A-21 described with reference to FIG. 9A. The second region 141-2 of FIG. 9C corresponds to the second outer region A-22 described with reference to FIG. 9A.

A second inorganic encapsulation layer 143 of FIG. 9A may also be formed through the method described with reference to FIGS. 9B and 9C. Accordingly, the second inorganic encapsulation layer 143 may be aligned with the first inorganic encapsulation layer 141, and the second inorganic encapsulation layer 143 may also include the first outer region A-21 and the second outer region A-22.

Referring back to FIG. 9A, a preliminary region B1 extending from the outer region A-2 toward the edge 110-EG of the base layer 110 is defined outside the outer region A-2. Hereinafter, in describing an arrangement relationship between one region and the other region, the fact that the other region is disposed outside one region indicates that the other region is disposed closer to the edge 110-EG of the base layer 110 than the one region is to the edge 110-EG of the base layer 110.

The encapsulation layer 140 is not disposed in the preliminary region B1. At least one of the first insulating layer 210, the second insulating layer 230, or the third insulating layer 250 of the input sensor ISL is disposed in the preliminary region B1. As shown in FIG. 9A, edges of the first insulating layer 210, the second insulating layer 230, and the third insulating layer 250 may be aligned. In an embodiment of the inventive concept, the third insulating layer 250 may not be disposed, or the edge of the third insulating layer 250 may be disposed closer to the edge of the base layer 110 than the edges of the first insulating layer 210 and the second insulating layer 230 of the input sensor ISL are to the edge of the base layer 110.

Referring to FIG. 9A, a margin region C1 extending from the preliminary region B1 toward the edge 110-EG of the base layer 110 is defined outside of the preliminary region B1. The margin region C1 is defined between the preliminary region B1 and the edge 110-EG of the base layer 110. In the margin region C1, the first insulating layer 210, the second insulating layer 230, and the third insulating layer 250 of the input sensor ISL are not disposed. An upper surface of the fifth insulating layer 50 of the driving element layer 120 is exposed from the insulating layers 210, 230, and 250 of the input sensor ISL.

As in the deposition process shown in FIGS. 9B and 9C, a deposition process is commonly performed on a plurality of unit cells in a manufacturing process of a display device. After the manufacturing process of the display device is completed, each of the unit cells is divided from a working substrate to form a display module. The dividing process is performed as a cutting process, and the margin region C1 is obtained in consideration of work errors in the cutting process. One unit cell UC is shown in FIGS. 9B and 9C.

A crack dam CRD may be disposed in the margin region C1. The crack dam CRD may include a stack structure corresponding to the stacked structure of the first to fifth insulating layers 10 to 50 of the driving element layer 120. The crack dam CRD may have a stack structure of fewer than the first to fifth insulating layers 10 to 50. In an embodiment, the crack dam CRD may include a stack structure corresponding to the stack structure of the third to fifth insulating layers 30 to 50, for example. In an embodiment of the inventive concept, a plurality of crack dams CRD may be disposed.

The crack dam CRD is disposed to be spaced apart from the edges of the first to fifth insulating layers 10 to 50 of the driving element layer 120. It may be considered that the crack dam CRD spaced apart from the first to fifth insulating layers 10 to 50 of the driving element layer 120 is defined as grooves are defined in the first to fifth insulating layers 10 to 50 of the driving element layer 120. An insulating pattern IP may cover the crack dam CRD. The insulating pattern IP may be formed through the same process as the sixth insulating layer 60.

When external shocks are applied to an edge of the display module DM, the crack dam CRD breaks and absorbs the shocks. The grooves between the crack dam CRD and the first to fifth insulating layers 10 to 50 of the driving element layer 120 stop cracking and prevent the cracking from further developing into the display region DP-DA.

Figure 10A:
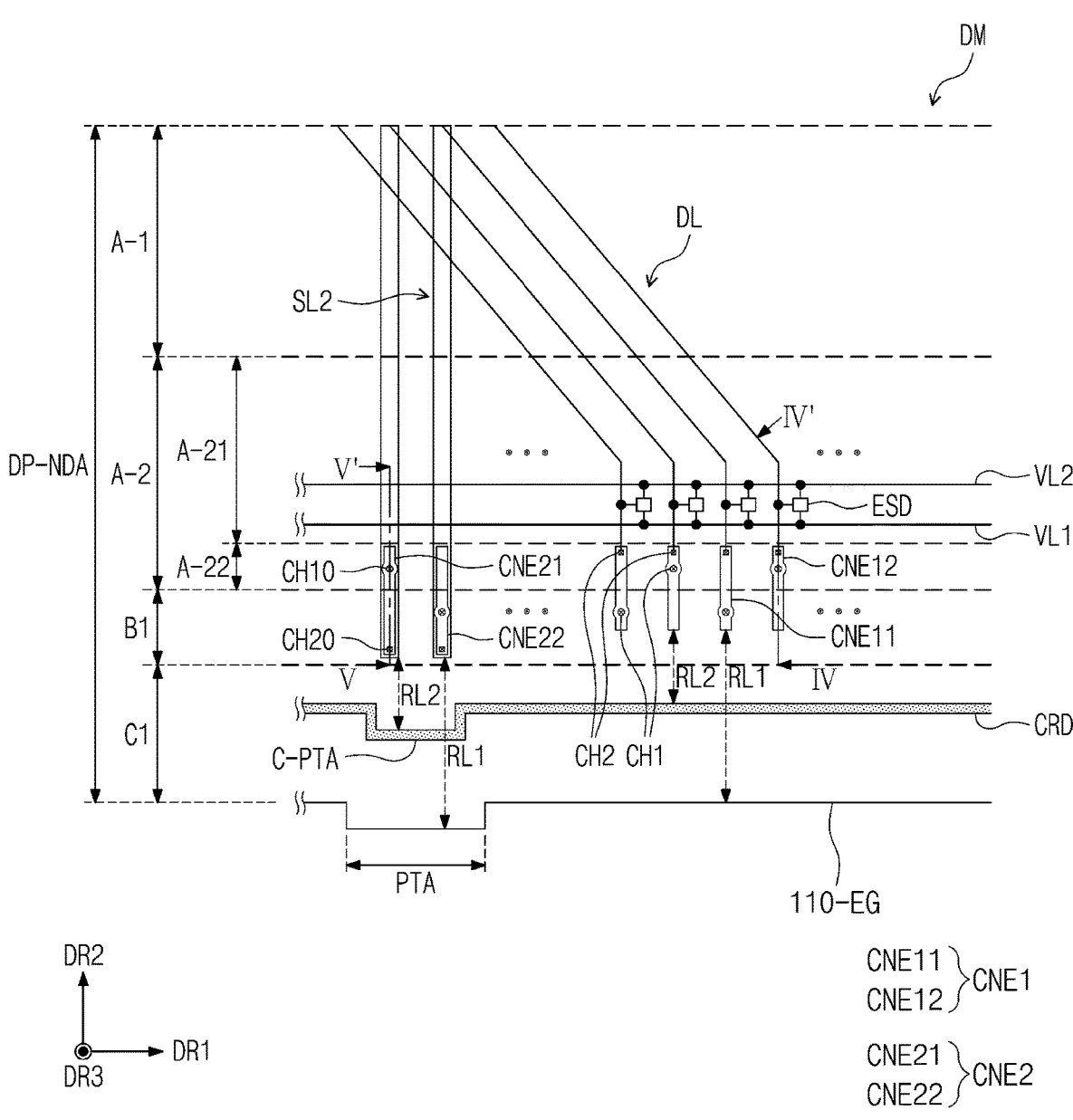
FIG. 10A is a plan view enlarging an embodiment of a non-display region of a display module according to the inventive concept.
Figure 10B:
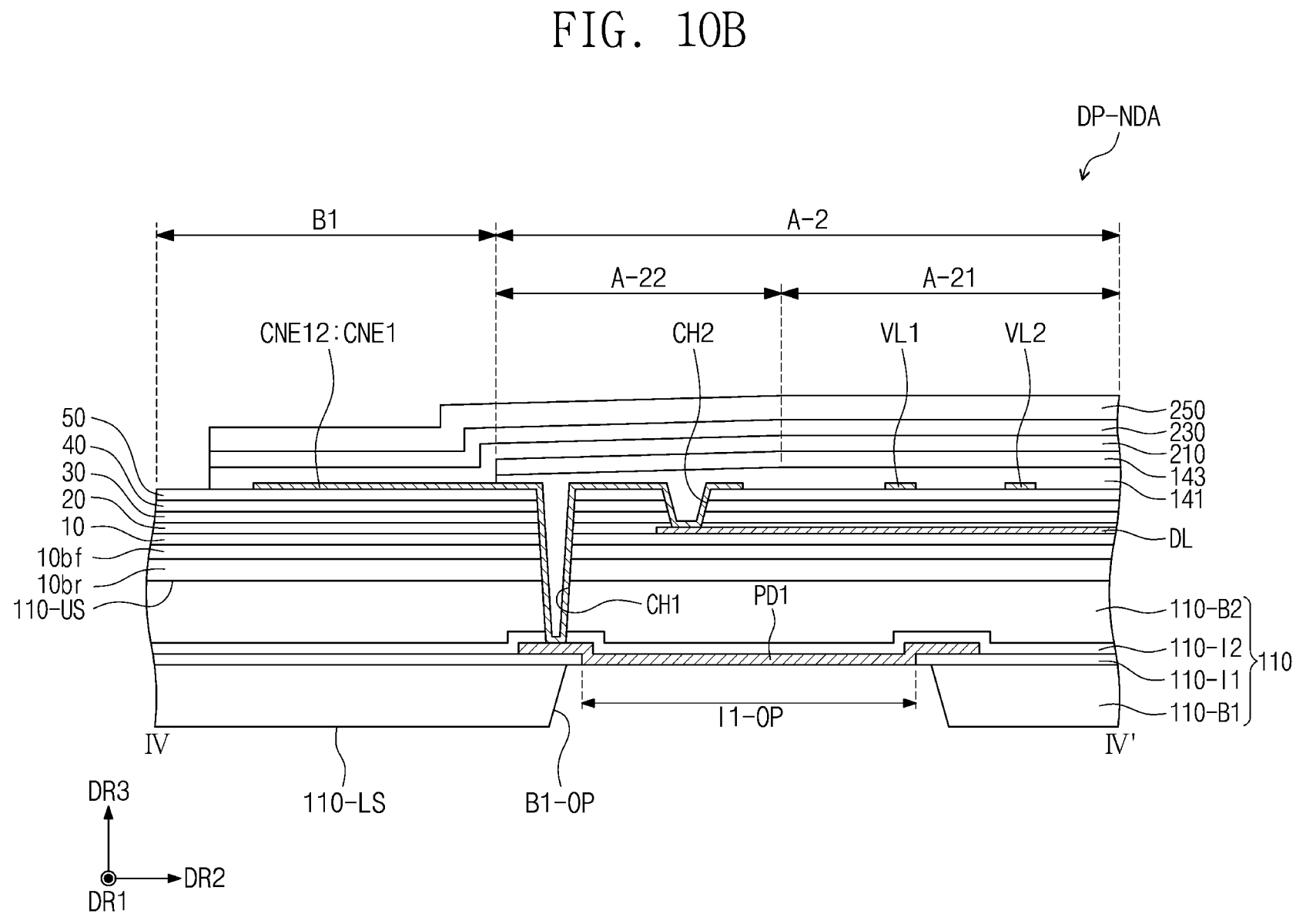
Figure 10C:
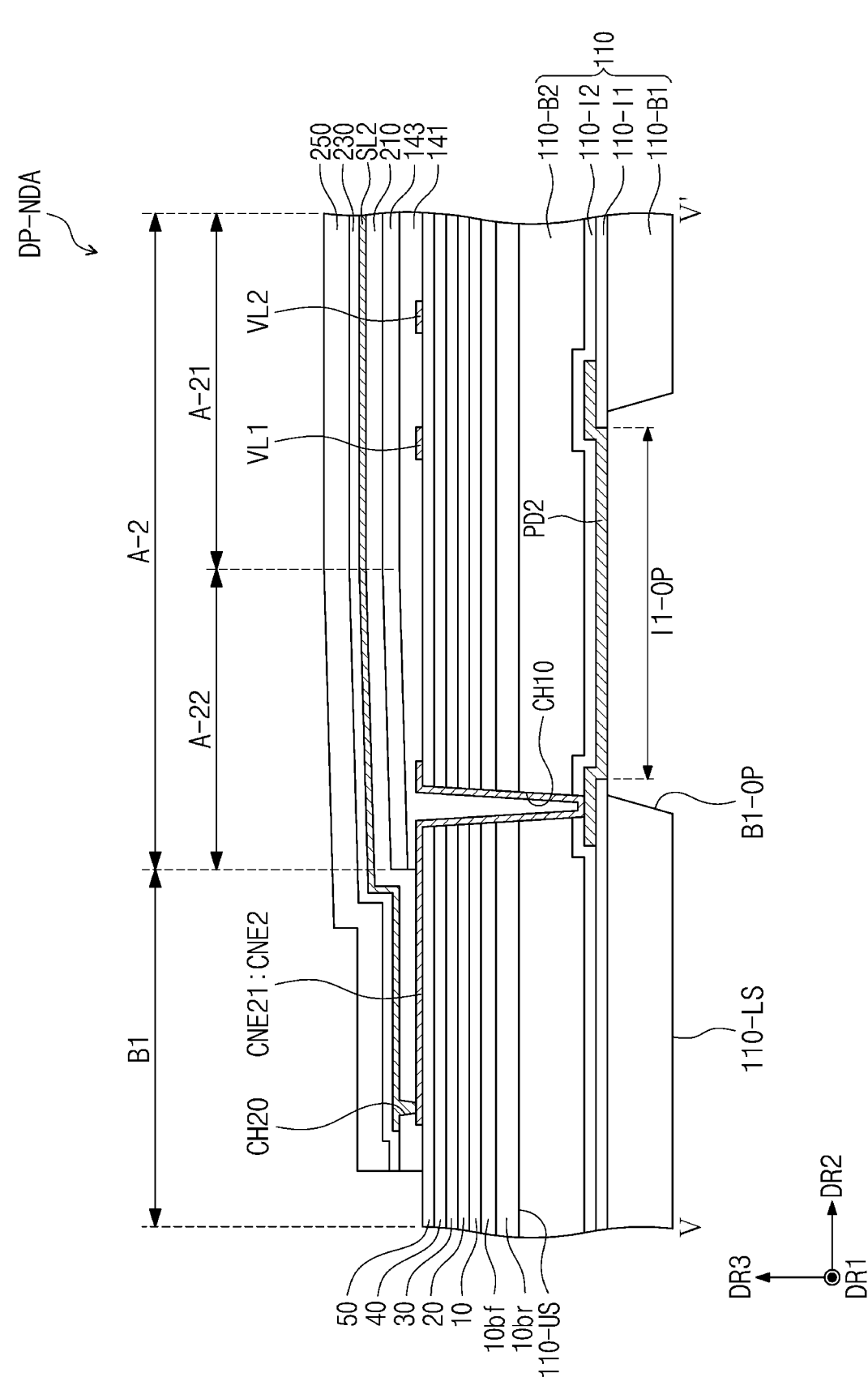
FIG. 10C is a cross-sectional view of a display module corresponding to V-V' of FIG. 10A.
Figure 10D:
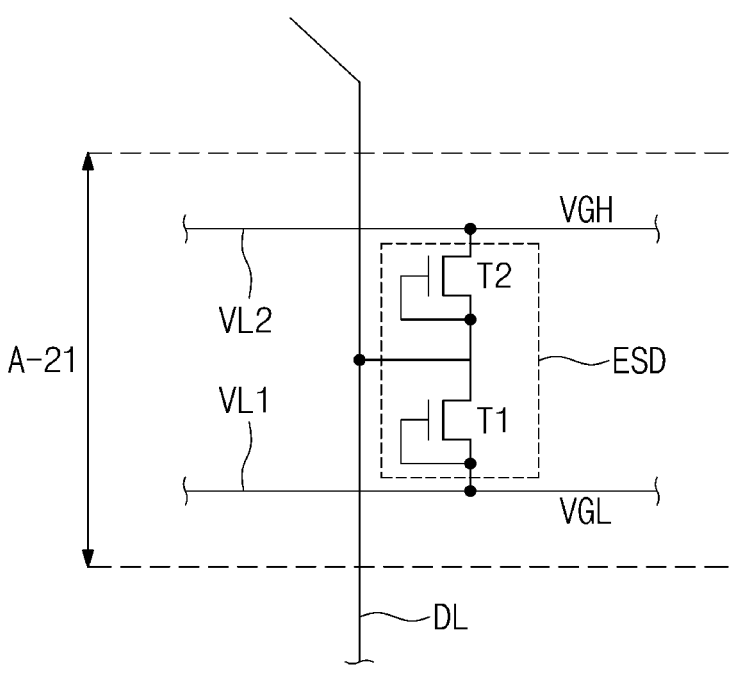
FIG. 10D is a circuit diagram of a static electricity protection circuit of FIG. 10A.

FIG. 10A is a plan view enlarging an embodiment of a non-display region DP-NDA of a display module DM according to the inventive concept. FIG. 10B is a cross-sectional view of a display module DM corresponding to IV-IV' of FIG. 10A. FIG. 10C is a cross-sectional view of a display module DM corresponding to V-V' of FIG. 10A. FIG. 10D is a circuit diagram of a static electricity protection circuit ESD of FIG. 10A.

FIG. 10A further enlarges the display region DP-DA shown in FIG. 8, and shows the inner region A-1, the outer region A-2, the preliminary region B1, and the margin region C1 from FIG. 9A. In FIG. 10A, the second power line PL2 may be disposed in the inner region A-1. FIG. 10A shows some data lines DL and some second signal lines SL2.

The first voltage line VL1 and the second voltage line VL2 may be disposed in the first outer region A-21. The static electricity protection circuit ESD may be disposed in the first outer region A-21. The first connection electrodes CNE1 and the second connection electrodes CNE2 are disposed outside the first outer region A-21. The first connection electrodes CNE1 are disposed in a one-to-one correspondence with the data lines DL, and the second connection electrodes CNE2 are disposed in a one-to-one correspondence with the second signal lines SL2.

The first connection electrodes CNE1 and the second connection electrodes CNE2 overlap the outer region A-2. Some or all of the first connection electrodes CNE1 and the second connection electrodes CNE2 may overlap the outer region A-2, and in the illustrated embodiment, the first connection electrodes CNE1 and the second connection electrodes CNE2 partially overlapping the outer region A-2 are shown as one of embodiments.

A portion of each of the first connection electrodes CNE1 and the second connection electrodes CNE2 overlaps the second outer region A-22. The first connection electrodes CNE1 and the second connection electrodes CNE2 may be disposed inside the second outer region A-22 and the preliminary region B1. Portions of the first connection electrodes CNE1 and the second connection electrodes CNE2 overlap the second outer region A-22, and accordingly, an additional region for disposing the first connection electrodes CNE1 and the second connection electrodes CNE2 may be reduced or omitted. As the first connection electrodes CNE1 and the second connection electrodes CNE2 are disposed downward, an area of the preliminary region B1 may increase, and in the illustrated embodiment, as the preliminary region B1 is reduced, an area of the non-display region DP-NDA may be reduced.

The first connection electrodes CNE1 and the second connection electrodes CNE2 may be spaced apart from the edge 110-EG of the base layer 110 by a same distance RL1. In the edge 110-EG of the base layer 110, a protrusion region PTA protruding outward may be defined in a region corresponding to the second connection electrodes CNE2.

In an embodiment of the inventive concept, the protrusion region PTA may be omitted. The edge 110-EG of the base layer 110 may be in the form of a straight line extending in the first direction DR1. In this case, the second connection electrodes CNE2 may be disposed closer to the edge 110-EG of the base layer 110 than the first connection electrodes CNE1 is to the edge 110-EG of the base layer 110.

The crack dam CRD may be disposed in the margin region C1. In the crack dam CRD, a protrusion region C-PTA protruding outward may be defined in a region corresponding to the second connection electrodes CNE2. The first connection electrodes CNE1 and the second connection electrodes CNE2 may be spaced apart from the crack dam CRD by a same distance RL2.

Referring to FIG. 10B, a connection relationship between the first connection electrode CNE1 and the first pad electrode PD1 will be described in detail. In FIG. 10B, the first connection electrode CNE1 is disposed in the same layer as the first connection pattern CNP1 of FIG. 6, and a portion of the data line DL overlapping the non-display region DP-NDA is disposed in the same layer as the gate GT1 of the silicon transistor S-TFT of FIG. 6.

The first pad electrode PD1 of FIG. 10B is disposed in every first connection electrode CNE1 of FIG. 10A. A plurality of first pad electrodes PD1 may be spaced apart along the first direction DR1 to correspond to the arrangement of the first connection electrodes CNE1 of FIG. 10A. Although the first pad electrode PD1 overlapping the first outer region A21 and the second outer region A22 is shown in FIG. 10B in an embodiment, The first pad electrode PD1 may further extend toward the inner region A1 of FIG. 10A. Accordingly, a first opening B1-OP and a second opening I1-OP may further extend toward the inner region A1.

The first opening B1-OP may commonly expose the plurality of first pad electrodes PD1. One first opening B1-OP exposes the plurality of first pad electrodes PD1 and regions therebetween to the outside. In contrast, the second opening I1-OP may be formed for each of the plurality of first pad electrodes PD1, separately.

The first pad electrode PD1 is exposed to the outside through a lower surface 110-LS of the base layer 110 for rear surface bonding with the flexible printed circuit board FCB (refer to FIG. 2). The lower surface 110-LS of the base layer 110 faces an upper surface 110-US of the base layer 110 in the third direction DR3. The lower surface 110-LS of the base layer 110 corresponds to a rear surface of the display panel DP (refer to FIG. 9A).

FIG. 10B shows an embodiment of an arrangement relationship between a base layer 110 and a first pad electrode PD1 according to the inventive concept. In the illustrated embodiment, the first pad electrode PD1 may be embedded in the base layer 110. However, the inventive concept is not limited thereto, and the first pad electrode PD1 may be disposed on the lower surface 110-LS of the base layer 110. The base layer 110 may include a single-layer synthetic resin layer, or even when the base layer 110 includes multiple layers, the first opening B1-OP and the second opening I1-OP, which will be described later, may not be defined.

As shown in FIG. 10B, the base layer 110 may include a first synthetic resin layer 110-B1, a first base inorganic layer 110-I1, a second base inorganic layer 110-I2, and a second synthetic resin layer 110-B2. The first synthetic resin layer 110-B1 provides the lower surface 110-LS of the base layer 110, and in the first synthetic resin layer 110-B1, a first opening B1-OP exposing the first pad electrode PD1 is defined The first base inorganic layer 110-I1 is disposed on the first synthetic resin layer 110-B1, exposes the first pad electrode PD1, and has a second opening I1-OP corresponding to the first opening B1-OP defined therein. The second base inorganic layer 110-I2 is disposed on the first base inorganic layer 110-I1 and covers the first pad electrode PD1. The second synthetic resin layer 110-B2 is disposed on the second base inorganic layer 110-I2. The first synthetic resin layer 110-B1 and the second synthetic resin layer 110-B2 may include polyimide, and the first base inorganic layer 110-I1 and the second base inorganic layer 110-I2 may include silicon nitride, silicon oxide, or silicon oxy nitride.

The first connection electrode CNE1 is connected to the first pad electrode PD1 through the first contact hole CH1 and connected to the data line DL through the second contact hole CH2. The first contact hole CH1 passes through the corresponding insulating layers 10br to 50 among the plurality of insulating layers 10br to 70 (refer to FIG. 6) and extends to the base layer 110. In the illustrated embodiment, the first contact hole CH1 passes through the barrier layer 10br to the fifth insulating layer 50. The first contact hole CH1 further passes through the second base inorganic layer 110-I2 and the second synthetic resin layer 110-B2 below the barrier layer 10br. The second contact hole CH2 passes through the second insulating layer 20 to the fifth insulating layer 50.

Referring to FIGS. 10A and 10B, a structure in which the first connection electrode CNE1 connects the data line DL and the first pad electrode PD1 is described as one of embodiments. The arrangement relationship between the first connection electrode CNE1 and the first pad electrode PD1 may also apply to other signal lines shown in FIG. 8. In an embodiment, the first connection electrode CNE1 and the first pad electrode PD1 may be disposed to correspond to the control signal line CSL, the first voltage line VL1, the second voltage line VL2, the first power line PL1, and the second power line PL2 in FIG. 8, for example. One first pad electrode PD1 may be disposed for each signal line, and a plurality of first pad electrodes PD1 may be arranged along the first direction DR1 in FIGS. 8 and 10A. A plurality of first pad electrodes PD1 may be disposed on some signal lines such as the first power line PL1 and the second power line PL2.

Referring to FIG. 10A, it is seen that the position of the first contact hole CH1 is different according to the first connection electrodes CNE1. Adjacent first contact holes CH1 are alternately disposed in a zigzag pattern along the first direction DR1. As the first contact holes CH1 are alternately arranged, a short circuit defect between adjacent first connection electrodes CNE1 in the process of forming the first contact holes CH1 may be reduced.

The first connection electrode CNE1 may include a (1-1)-th connection electrode CNE11 and a (1-2)-th connection electrode CNE12 that are distinguished according to the position of the first contact hole CH1. The (1-1)-th connection electrode CNE11 and the (1-2)-th connection electrode CNE12 are alternately disposed along the first direction DR1. The (1-1)-th connection electrode CNE11 connects the first data line (or one data line) and the (1-1)-th pad electrode, and the (1-2)-th connection electrode CNE12 connects the second data line (or another data line) adjacent to the first data line and the (1-2)-th pad electrode.

The second contact holes CH2 may all be disposed in the second outer region A-22. The first contact hole CH1 corresponding to the (1-1)-th connection electrode CNE11 may be disposed in the preliminary region B1, and the first contact hole CH1 corresponding to the (1-2)-th connection electrode CNE12 may be disposed in the second outer region A-22.

The second connection electrodes CNE2 may be disposed closer to an end of the preliminary region B1 (or a border line between the preliminary region B1 and the margin region C1) than the first connection electrodes CNE1 is to the end of the preliminary region B1. This is because the fourth contact hole CH20 corresponding to the second connection electrodes CNE2 is disposed to be more outer side than the third contact hole CH10 aligned in the first contact hole CH1. Hereinafter, the connection relationship between the second connection electrode CNE2 and the second pad electrode PD2 will be described in more detail with reference to FIG. 10C.

Referring to FIG. 10C, the second pad electrode PD2 is substantially the same as the first pad electrode PD1 described with reference to FIG. 10B. The second pad electrode PD2 has the same material and the same stack structure as the first pad electrode PD1. The second pad electrode PD2 is exposed to the outside through a lower surface 110-LS of the base layer 110 for rear surface bonding with the flexible printed circuit board FCB (refer to FIG. 2). The second pad electrode PD2 may be embedded in the base layer 110 like the first pad electrode PD1.

The second connection electrode CNE2 is electrically connected to the second pad electrode PD2. The second connection electrode CNE2 is connected to the second pad electrode PD2 through the third contact hole CH10. In the illustrated embodiment, the third contact hole CH10 passes through the barrier layer 10br to the fifth insulating layer 50. The third contact hole CH10 further passes through the second base inorganic layer 110-I2 and the second synthetic resin layer 110-B2 below the barrier layer 10br.

The second signal lines SL2 are electrically connected to the second connection electrode CNE2. The second signal lines SL2 is connected to the second connection electrode CNE2 through the fourth contact hole CH20 passing through the corresponding insulating layers among the plurality of insulating layers 10br to 70 (refer to FIG. 6) and the corresponding insulating layer among the insulating layers 210, 230, and 250 of the input sensor ISL. In the illustrated embodiment, the second connection electrode CNE2 is disposed on the fifth insulating layer 50, and the sixth insulating layer 60 (refer to FIG. 6) and the seventh insulating layer 70 (refer to FIG. 6) are not disposed on the second connection electrode CNE2, and accordingly, the fourth contact hole CH20 does not pass through the plurality of insulating layers 10br to 70. The fourth contact hole CH20 passing through the first insulating layer 210 of the input sensor ISL is shown as one of embodiments.

Referring to FIG. 10A, it is seen that the positions of the third contact holes CH10 are different according to the second connection electrodes CNE2. The third contact holes CH10 may maintain the arrangement of the first contact holes CH1 and may also be consecutively disposed along the first contact holes CH1. The third contact hole CH10 corresponding to the (2-1)-th connection electrode CNE21 may be disposed in the second outer region A-22, and the third contact hole CH10 corresponding to the (2-2)-th connection electrode CNE22 may be disposed in the preliminary region B1.

The positions of the fourth contact holes CH20 may be the same regardless of the second connection electrodes CNE2. The fourth contact holes CH20 may be arranged in the first direction DR1, and the fourth contact holes CH20 may not overlap the outer region A-2. The fourth contact holes CH20 may overlap the preliminary region B1 placed at an outer side of the outer region A-2.

Referring to FIG. 10D, the static electricity protection circuit ESD may overlap the first outer region A-21. The static electricity protection circuit ESD includes a first transistor T1 diode-connected from the first voltage line VL1 to the data line DL, and a second transistor T2 diode-connected from the data line DL to the second voltage line VL2. The first voltage line VL1 may receive the first voltage VGL, and the second voltage line VL2 may receive the second voltage VGH higher than the first voltage VGL.

A source or drain of the first transistor T1 is electrically connected to a gate of the first transistor T1, and a source or drain of the second transistor T2 is electrically connected to a gate of the second transistor T2. The first transistor T1 and the second transistor T2 may have the same stack structure as the silicon transistor S-TFT shown in FIG. 6. In an embodiment, a connection pattern disposed in the same layer as the first connection pattern CNP1 shown in FIG. 6 connects the gate of the first transistor T1 and the source or drain of the first transistor T1, for example. The first voltage line VL1 is disposed in the same layer as the second connection pattern CNP2 shown in FIG. 6. The first voltage line VL1 may be connected to the connection pattern connecting the gate of the first transistor T1 and the source or drain of the first transistor T1. In an embodiment of the inventive concept, the first voltage line VL1 disposed in the same layer as the first connection pattern CNP1 shown in FIG. 6 may be connected to the gate of the first transistor T1 and the source or drain of the first transistor T1.

When a voltage higher than the second voltage VGH is applied to the data line DL due to static electricity, the second transistor T2 is turned on to allow current to flow to the second voltage line VL2. Accordingly, the voltage of the data line DL decreases. Conversely, when a voltage lower than the first voltage VGL is applied to the data line DL, the first transistor T1 is turned on to allow current to flow to the data line DL from the first voltage line VL1. Accordingly, the voltage of the data line DL increases. Accordingly, the voltage of the data line DL may maintain a level between the first voltage VGL and the second voltage VGH. Accordingly, a circuit connected to the data line DL may be protected from static electricity.

FIGS. 11 to 16 are plan views enlarging an embodiment of a non-display region DP-NDA of a display module DM according to the inventive concept. Hereinafter, as for detailed descriptions of the same components as the components described with reference to FIGS. 8 to 10D, the descriptions of FIGS. 8 to 10D may be applied.

Figure 11:
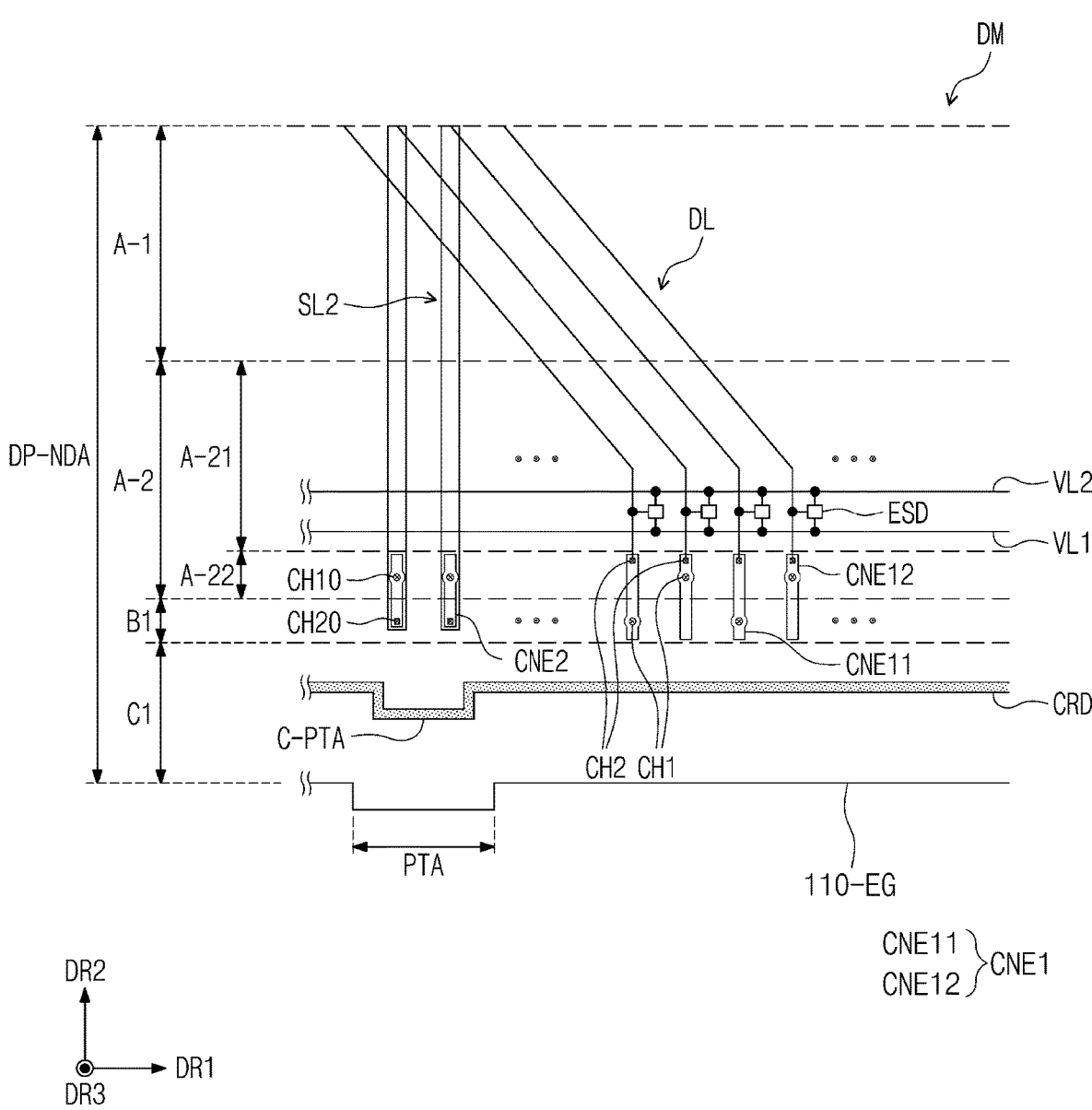

FIG. 11 shows a non-display region DP-NDA corresponding to FIG. 10A. Referring to FIG. 11, it is seen that the preliminary region B1 becomes smaller than the preliminary region B1 of FIG. 10A.

The second connection electrodes CNE2 may be disposed farther from an end of the preliminary region B1 (or a border line between the preliminary region B1 and the margin region C1) than the first connection electrodes CNE1. The second connection electrodes CNE2 may be shorter in length than the first connection electrodes CNE1.

The positions of the third contact holes CH10 may be the same regardless of the second connection electrodes CNE2. The third contact holes CH10 may have a different arrangement from the first contact holes CH1, and the third contact holes CH10 may be aligned in the first contact hole CH1 of the (1-2)-th connection electrode CNE12.

In addition, the positions of the fourth contact holes CH20 may be the same regardless of the second connection electrodes CNE2. The fourth contact holes CH20 may be arranged in the first direction DR1, and the fourth contact holes CH20 may overlap the preliminary region B1. The fourth contact holes CH20 may be aligned in the first contact hole CH1 of the (1-1)-th connection electrode CNE11.

Figure 12:
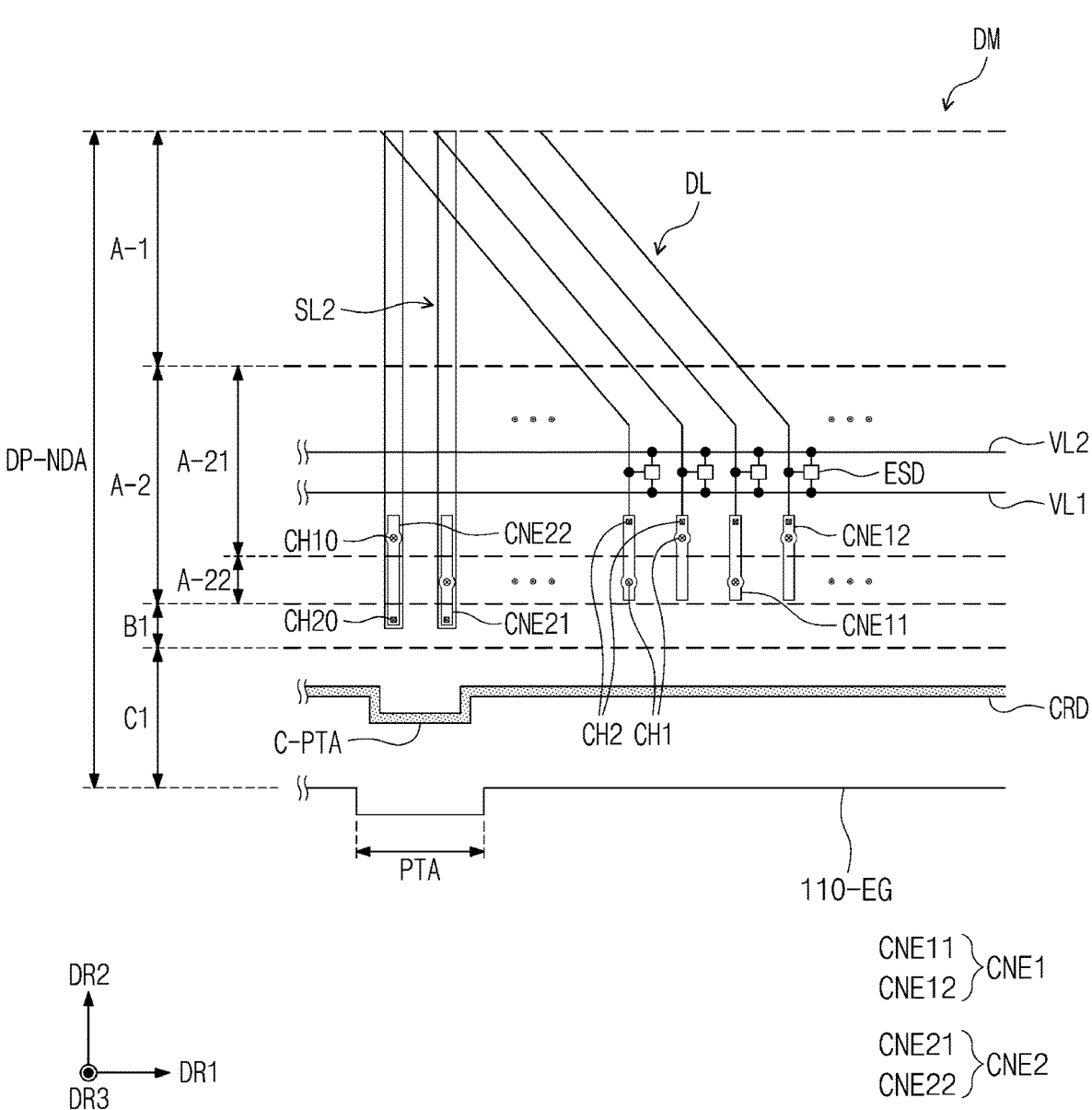

FIG. 12 shows a non-display region DP-NDA corresponding to FIG. 10A. Referring to FIG. 12, The first voltage line VL1, the second voltage line VL2, and the static electricity protection circuit ESD move to a further upper side in the first outer region A-21 so as to be placed closer to the inner region A-1.

Referring to FIG. 12, the first contact holes CH1 corresponding to the (1-2)-th connection electrode CNE12 are disposed in the first outer region A-21. The first contact holes CH1 corresponding to the (1-1)-th connection electrode CNE11 are disposed in the second outer region A-22. Third contact holes CH10 corresponding to the (2-2)-th connection electrode CNE22 are disposed in the first outer region A-21. Third contact holes CH10 corresponding to the (2-1)-th connection electrode CNE21 are disposed in the second outer region A-22. The fourth contact holes CH20 may overlap the preliminary region B1.

Referring to FIG. 12, compared to FIG. 10A, the first connection electrodes CNE1 and the second connection electrodes CNE2 are displaced to be closer to the display region DP-DA. Accordingly, the preliminary region B1 may be reduced, and an area of the non-display region DP-NDA may be reduced.

Figure 13:
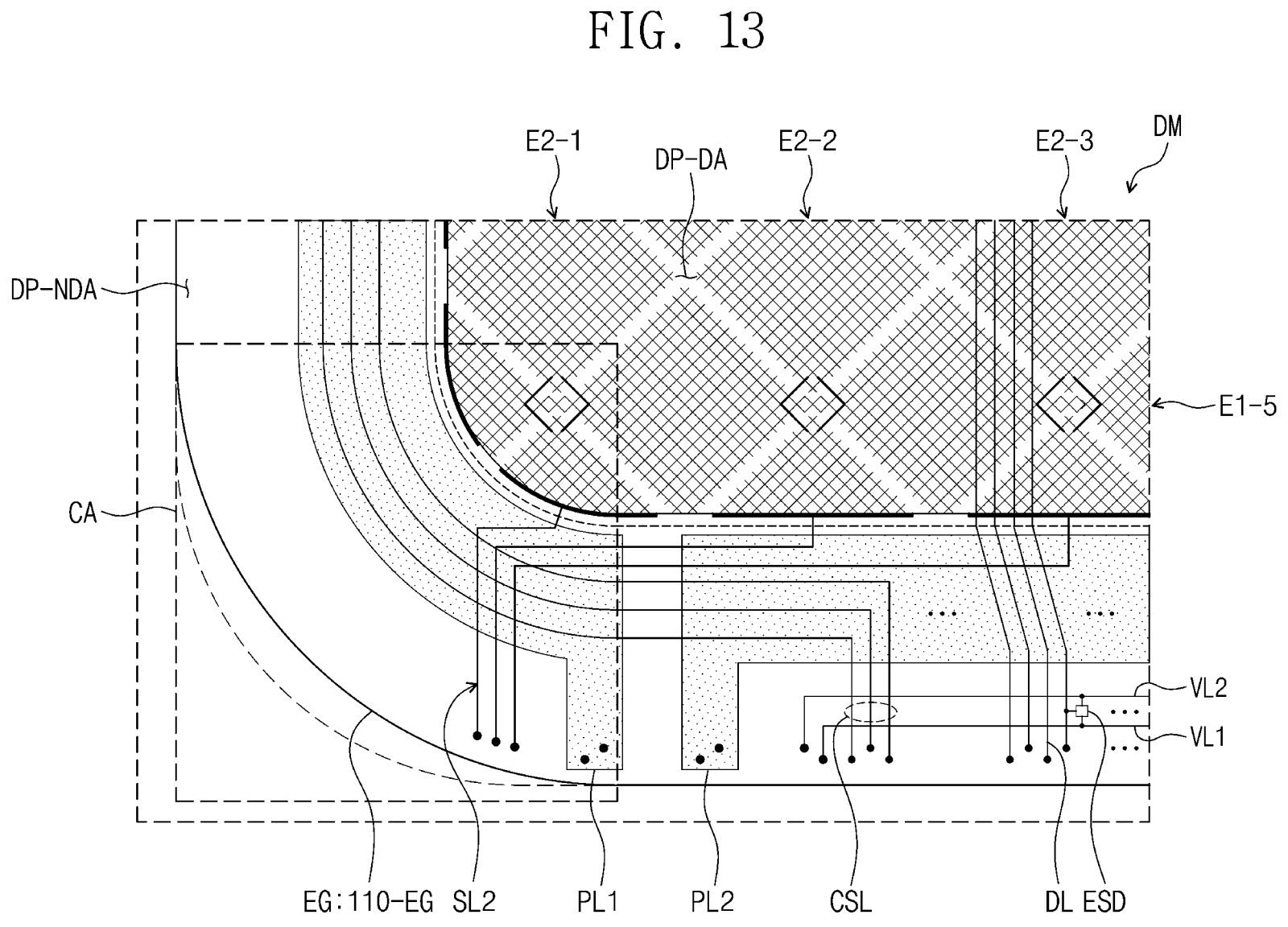

FIG. 13 shows a non-display region DP-NDA corresponding to FIG. 8. Referring to FIG. 13, the second signal lines SL2 overlap the corner region CA. As the second signal lines SL2 overlap the corner region CA, the second connection electrodes CNE2 (refer to FIG. 10C) connected to the second signal lines SL2 are disposed in the corner region CA. The second pad electrode PD2 (refer to FIG. 10C) is also disposed in the corner region CA. A cross-sectional structure of the display module DM corresponding to ends of the second signal lines SL2 shown in FIG. 13 may be substantially the same as that of FIG. 10C.

Except that the second connection electrodes CNE2 are disposed in the corner region CA, positions of the second connection electrodes CNE2 with respect to the non-display region DP-NDA may be the same as the position of any one of the second connection electrodes CNE2 described with reference to FIGS. 10A to 12. As the second connection electrodes CNE2 are disposed in the corner region, the protrusion region PTA described with reference to FIG. 10A may be omitted. This is because the margin region C1 may be obtained more through a reduction in the curvature of a curved region of the edge 110-EG of the base layer 110. In FIG. 13, the curved region of the edge 110-EG of the base layer 110 having a reduced curvature is shown in dotted line. That is, even when the curved region of the edge 110-EG of the base layer 110 does not protrude lower than the straight region of the edge 110-EG of the base layer 110, as described with reference to FIG. 10A, the first connection electrodes CNE1 and the second connection electrodes CNE2 may be spaced apart from the edge 110-EG of the base layer 110 by the same distance.

Figure 14:
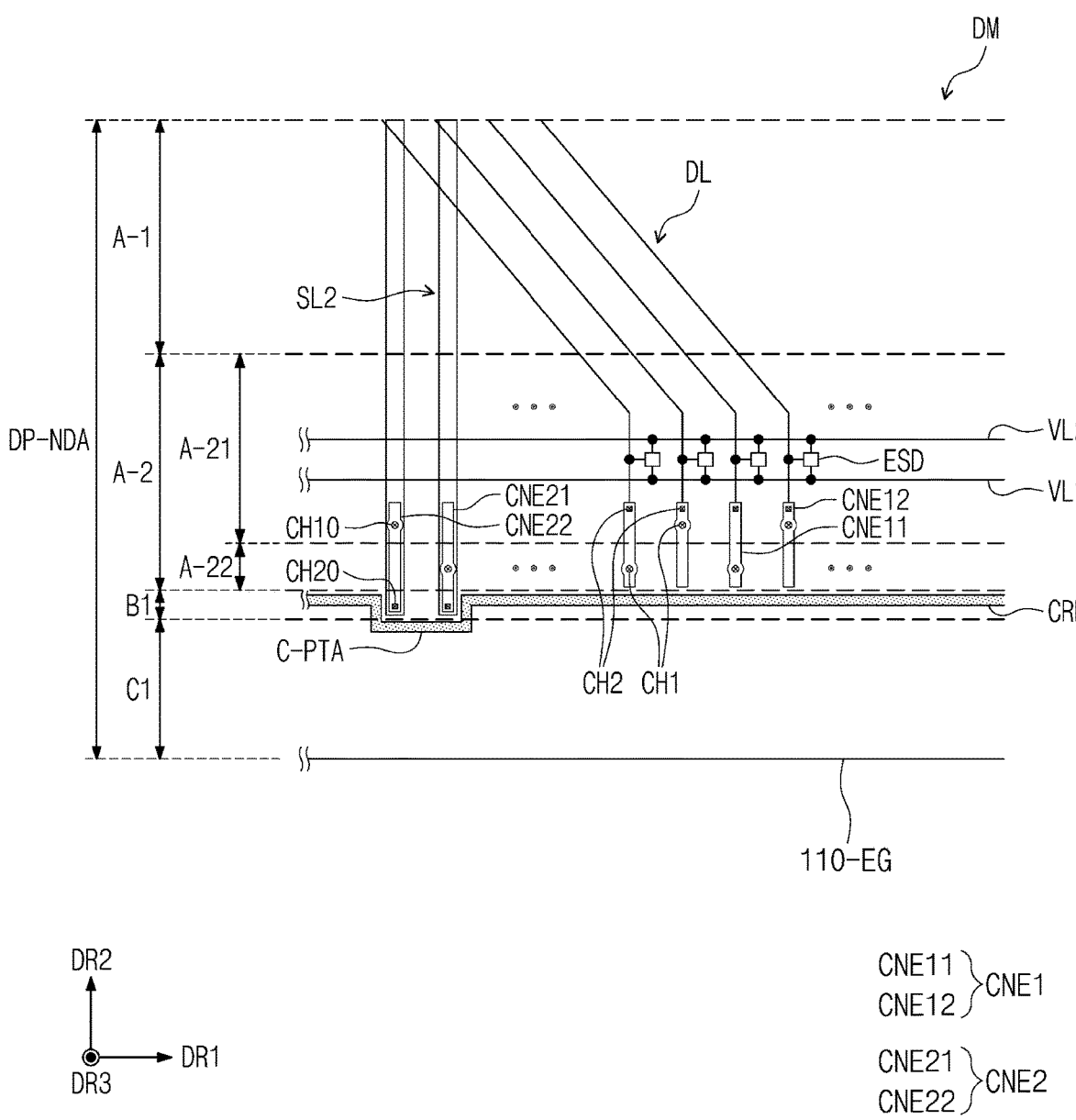
Figure 15:
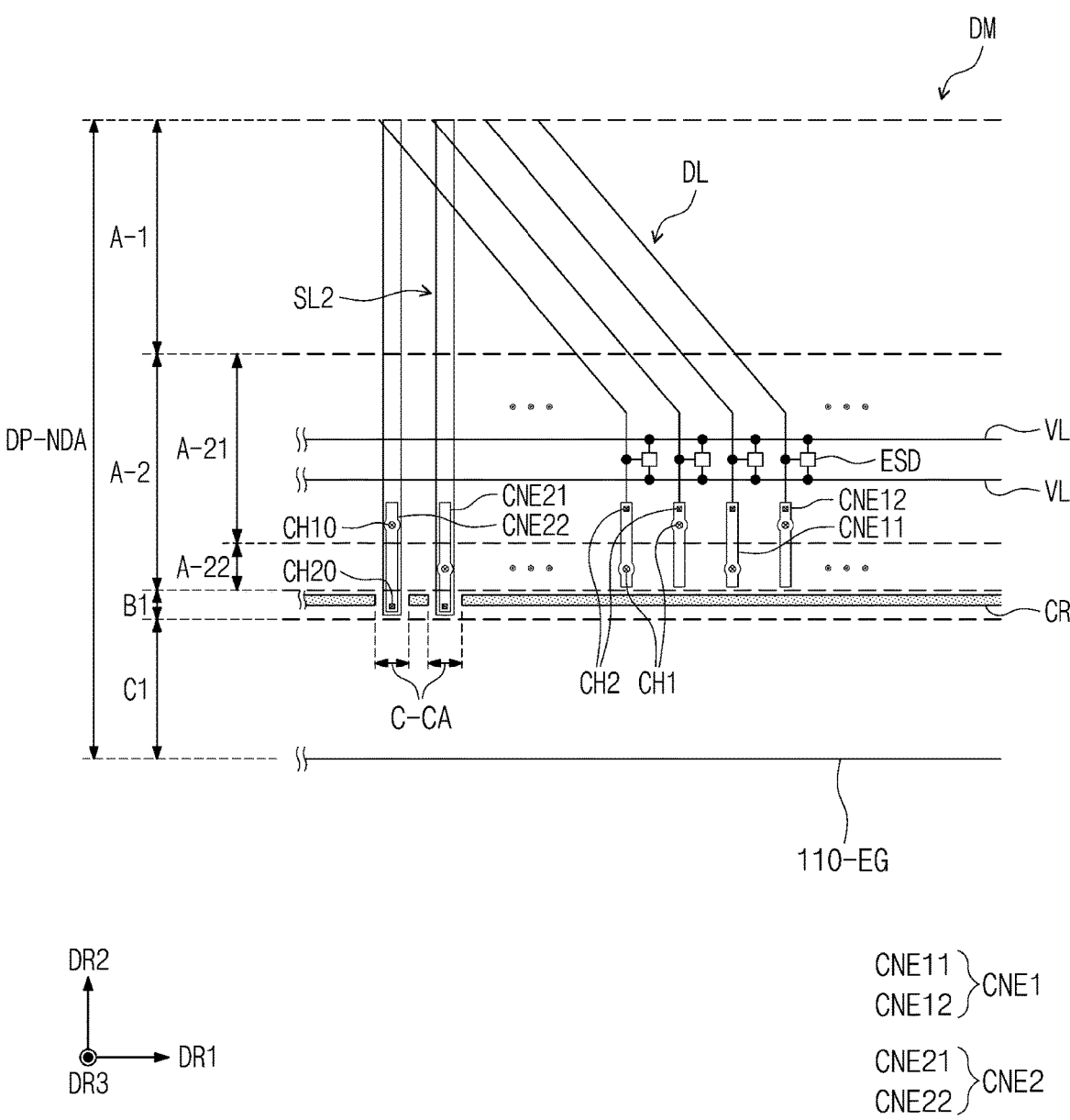

FIGS. 14 and 15 show a non-display region DP-NDA corresponding to FIG. 12. Referring to FIG. 14, a protrusion region C-PTA is defined in the crack dam CRD, and the edge 110-EG of the base layer 110 may be straight without the protrusion region PTA (refer to FIG. 12). A portion of the crack dam CRD may be disposed in the preliminary region B1. The preliminary region B1 may be reduced and the margin region C1 may be sufficiently obtained. In an embodiment of the inventive concept, contrary to what is shown in FIG. 14, the crack dam CRD is straight without the protrusion region C-PTA, and the protrusion region PTA (refer to FIG. 10A) may be defined at the edge 110-EG of the base layer 110.

Referring to FIG. 15, the protrusion region C-PTA (refer to FIG. 14) of the crack dam CRD is omitted. The crack dam CRD may be disposed in the preliminary region B1. A cutting region C-CA of the crack dam CRD is defined in a region overlapping the second connection electrode CNE2 of the crack dam CRD. The cutting region C-CA of the crack dam CRD is a region in which the crack dam CRD is not disposed. The crack dam CRD may be formed to be closer to the outer region A-2, and the margin region C1 in which the crack dam CRD is not disposed may be obtained.

Figure 16:
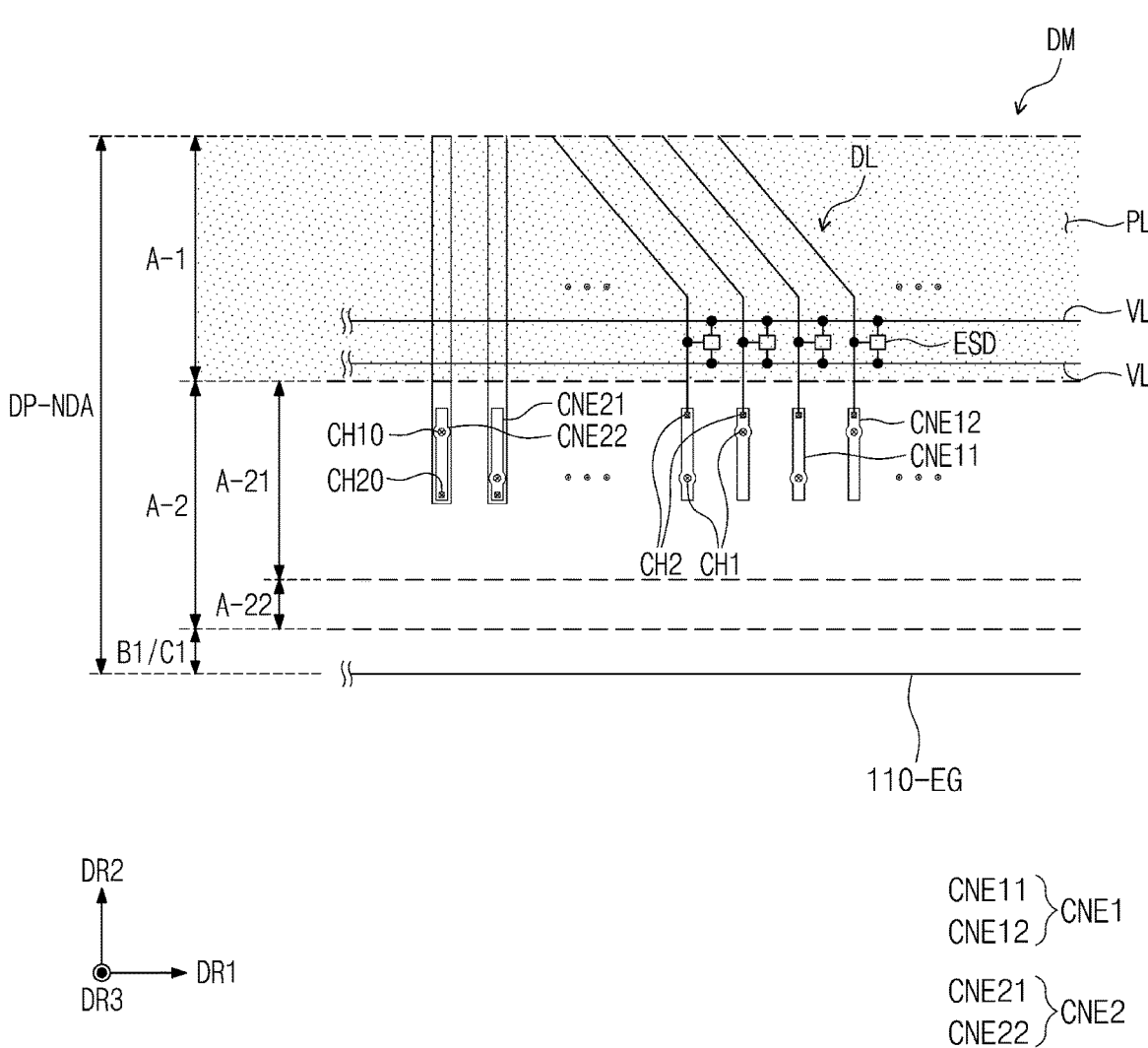

Referring to FIG. 16, compared to FIG. 12, the first voltage line VL1, the second voltage line VL2, and the static electricity protection circuit ESD move to a further upper side to be placed in the inner region A-1. The first voltage line VL1 and the second voltage line VL2 may be disposed in a different layer from the second power line PL2. The first voltage line VL1 and the second voltage line VL2 may overlap the second power line PL2 and may be disposed below the second power line PL2.

The first connection electrodes CNE1 may overlap the first outer region A-21 and may not overlap the second outer region A-22. The second connection electrodes CNE2 may also overlap the first outer region A-21 and may not overlap the second outer region A-22. The first connection electrodes CNE1 and the second connection electrodes CNE2 are not disposed in the second outer region A-22, and the preliminary region B1 and the margin region C1 may thus be reduced. Edges of the insulating layers 210, 230, and 250 of the input sensor ISL may be placed in the second outer region A-22 or in the preliminary region B1 and the margin region C1 which are provided to be small. Substantially, the second outer region A-22 may correspond to the margin region C1.

In an embodiment of the inventive concept, the second voltage line VL2 may be omitted in FIG. 16. The second power line PL2 may have a function of the second voltage line VL2, and the second power line PL2 may be connected to the second transistor T2 of FIG. 10D.

As described above, a flexible printed circuit board is bonded to a rear surface of a display panel (rear surface bonding). A non-display region of the display panel is not bent, and accordingly, defects caused when the non-display region of the display panel is bent may be prevented. An area of the bezel region of a window for covering the non-display region of the display panel may be reduced.

In order to reduce the non-display region, a region in which a connection electrode overlaps an encapsulation layer is disposed. A connection electrode is disposed in a region in which a first inorganic encapsulation layer and a second inorganic encapsulation layer are in contact, and thus the non-display region may be efficiently utilized.

Although the disclosure has been described with reference to a preferred embodiment of the inventive concept, it will be understood that the inventive concept should not be limited to these preferred embodiments but various changes and modifications may be made by those skilled in the art without departing from the spirit and scope of the disclosure.

Hence, the technical scope of the disclosure is not limited to the detailed descriptions in the specification but should be determined only with reference to the claims.

What is claimed is:

1. A display device comprising:
  a display panel including a display region and a non-display region; the display panel including:
    a base layer overlapping the display region and the non-display region;
    a first pad electrode exposed through a lower surface of the base layer;
    a plurality of insulating layers disposed on an upper surface of the base layer;
    a pixel disposed on the upper surface of the base layer and including a light-emitting element overlapping the display region and a transistor electrically connected to the light-emitting element;
    a signal line disposed on the upper surface of the base layer and overlapping at least the non-display region;
    a first connection electrode electrically connecting the signal line and the first pad electrode in the non-display region; and
    an encapsulation layer disposed on the upper surface of the base layer and covering the light-emitting element, the encapsulation layer including:
      a first inorganic encapsulation layer overlapping the display region and the non-display region;
      a second inorganic encapsulation layer disposed on the first inorganic encapsulation layer; and
      an organic encapsulation layer disposed between the first inorganic encapsulation layer and the second inorganic encapsulation layer; and
    an input sensor disposed on the display panel,
    wherein in a plan view, the encapsulation layer including an outer region in which the first inorganic encapsulation layer and the second inorganic encapsulation layer are in contact and an inner region in which the organic encapsulation layer is disposed, and
    the first connection electrode overlaps the outer region.

2. The display device of claim 1, wherein the first connection electrode is connected to the first pad electrode through a first contact hole passing through at least a portion of the base layer and a corresponding insulating layer among the plurality of insulating layers, and is connected to the signal line through a second contact hole passing through a corresponding insulating layer among the plurality of insulating layers.

3. The display device of claim 2, wherein the base layer comprises:
  a first synthetic resin layer providing the lower surface of the base layer and defining a first opening exposing the first pad electrode;

at first base inorganic layer disposed on the first synthetic resin layer and defining a second opening exposing the first pad electrode and corresponding to the first opening;
  a second base inorganic layer disposed on the first base inorganic layer and covering the first pad electrode; and
  a second synthetic resin layer disposed on the second base inorganic layer, and
  the first contact hole passes through the second synthetic resin layer and the second base inorganic layer.

4. The display device of claim 2, wherein:
  the first pad electrode comprises a (1-1)-th pad electrode and a (1-2)-th pad electrode;
  the signal line comprises a first signal line and a second signal line;
  the first connection electrode comprises a (1-1)-th connection electrode electrically connecting the (1-1)-th pad electrode and the first signal line, and a (1-2)-th connection electrode electrically connecting the (1-2)-th pad electrode and the second signal line;
  an edge of the base layer is disposed closer to the first contact hole than to the second contact hole;
  the first contact hole connecting the (1-1)-th connection electrode and the (1-1)-th pad electrode is disposed in the outer region; and
  the first contact hole connecting the (1-2)-th connection electrode and the (1-2)-th pad electrode is disposed between the outer region and the edge of the base layer.

5. The display device of claim 2, wherein an edge of the base layer is disposed closer to the first contact hole than to the second contact hole, and
  the second contact hole overlaps the outer region.

6. The display device of claim 5, wherein the first contact hole overlaps the outer region.

7. The display device of claim 5, wherein the outer region comprises a first outer region, and a second outer region extending outward when viewed in the plan view from the first outer region and having a smaller thickness than a thickness of the first outer region.

8. The display device of claim 7, wherein the first contact hole and the second contact hole overlap the second outer region.

9. The display device of claim 7, wherein the first pad electrode comprises a (1-1)-th pad electrode and a (1-2)-th pad electrode,
  the signal line comprises a first signal line and a second signal line, and
  the first connection electrode comprises a (1-1)-th connection electrode electrically connecting the (1-1)-th pad electrode and the first signal line, and a (1-2)-th connection electrode electrically connecting the (1-2)-th pad electrode and the second signal line.

10. The display device of claim 9, wherein the edge of the base layer is disposed closer to the first contact hole than to the second contact hole,
  the first contact hole connecting the (1-1)-th connection electrode and the (1-1)-th pad electrode is disposed in the second outer region, and
  the first contact hole connecting the (1-2)-th connection electrode and the (1-2)-th pad electrode is disposed in the first outer region.

11. The display device of claim 7, wherein the first contact hole and the second contact hole overlap the first outer region.

12. The display device of claim 11, wherein the display panel further comprises a static electricity protection circuit and a power line receiving a power voltage provided to the pixel, the signal line comprises a data line further overlapping the display region and electrically connected to the transistor, the static electricity protection circuit is electrically connected to the data line and disposed closer to the display region than the first connection electrode is to the display region, and the power line is disposed on the static electricity protection circuit.

13. The display device of claim 1, wherein the display panel further comprises:

a second pad electrode exposed through the lower surface of the base layer; and a second connection electrode electrically connected to the second pad electrode in the non-display region, the input sensor including:

at least one sensor insulating layer;

a sensing electrode; and a sensor signal line connected to the sensing electrode and connected to the second connection electrode in the non-display region.

14. The display device of claim 13, wherein the second connection electrode overlaps the outer region.

15. The display device of claim 14, wherein the second connection electrode is connected to the second pad electrode through a third contact hole passing through a corresponding insulating layer among the plurality of insulating layers, and the sensor signal line is connected to the second connection electrode through a fourth contact hole passing through the at least one sensor insulating layer.

16. The display device of claim 15, wherein the fourth contact hole is closer to an edge of the base layer than the third contact hole is to the edge of the base layer, and the third contact hole overlaps the outer region.

17. The display device of claim 16, wherein the fourth contact hole non-overlaps the outer region.

18. The display device of claim 13, wherein an edge of the base layer is disposed closer to the second connection electrode than to the first connection electrode.

19. The display device of claim 18, wherein the display panel further comprises a crack dam, the edge of the base layer is disposed closer to the crack dam than to the first connection electrode and the second connection electrode, and a distance between the crack dam and the first connection electrode is substantially equal to a distance between the crack dam and the second connection electrode.

20. The display device of claim 18, wherein the display panel further comprises a crack dam, the edge of the base layer is disposed closer to the crack dam than to the first connection electrode, and a cutting region of the crack dam is defined in a region of the crack dam overlapping the second connection electrode.

21. The display device of claim 13, wherein a distance between the second connection electrode and an edge of the base layer is substantially equal to a distance between the first connection electrode and the edge of the base layer.

22. The display device of claim 13, wherein the base layer has a substantially quadrangle shape, and a border line between the display region and the non-display region in a corner region of the base layer is substantially curved when viewed in the plan view, and the second connection electrode overlaps the outer region in the corner region of the base layer.

23. The display device of claim 1, wherein the signal line comprises a data line further overlapping the display region and electrically connected to the transistor.

24. The display device of claim 23, further comprising a static electricity protection circuit electrically connected to the data line, and a distance between the static electricity protection circuit and the display region is smaller than a distance between the first connection electrode and the display region.

25. The display device of claim 24, wherein the outer region comprises a first outer region, and a second outer region extending outward when viewed in the plan view from the first outer region and having a smaller thickness than a thickness of the first outer region, and the static electricity protection circuit overlaps the first outer region.

26. The display device of claim 25, wherein the static electricity protection circuit comprises:

a first transistor diode-connected to the data line from a first voltage line; and a second transistor diode-connected to a second voltage line from the data line, and the first voltage line receives a first voltage, and the second voltage line receives a second voltage higher than the first voltage.

27. A display device comprising:

a display panel including a display region and a non-display region, the display panel including:

a base layer overlapping the display region and the non-display region;

a first pad electrode exposed through a lower surface of the base layer;

a second pad electrode exposed through the lower surface of the base layer;

a plurality of insulating layers disposed on an upper surface of the base layer;

a pixel disposed on the upper surface of the base layer and including a light-emitting element overlapping the display region and a transistor electrically connected to the light-emitting element;

a signal line disposed on the upper surface of the base layer and overlapping at least the non-display region;

a first connection electrode electrically connecting the signal line and the first pad electrode in the non-display region;

a second connection electrode electrically connected to the second pad electrode in the non-display region; and an encapsulation layer disposed on the upper surface of the base layer and covering the light-emitting element, the encapsulation layer including:

a first inorganic encapsulation layer overlapping the display region and the non-display region;

a second inorganic encapsulation layer disposed on the first inorganic encapsulation layer; and an organic encapsulation layer disposed between the first inorganic encapsulation layer and the second inorganic encapsulation layer; and an input sensor disposed on the display panel, the input sensor including:

at least one sensor insulating layer;

a sensing electrode; and a sensor signal line connected to the sensing electrode and connected to the second connection electrode in the non-display region, wherein in a plan view, the encapsulation layer including an outer region in which the first inorganic encapsulation layer and the second inorganic encapsulation layer are in contact and an inner region in which the organic encapsulation layer is disposed, and the second connection electrode overlaps the outer region.

28. The display device of claim 27, wherein an edge of the base layer is disposed farther from the first connection electrode than the second connection electrode.

29. The display device of claim 27, wherein the first connection electrode is connected to the first pad electrode through a first contact hole passing through a corresponding insulating layer among the plurality of insulating layers, and is connected to the signal line through a second contact hole passing through a corresponding insulating layer among the plurality of insulating layers, the second connection electrode is connected to the second pad electrode through a third contact hole passing through a corresponding insulating layer among the plurality of insulating layers, and the sensor signal line is connected to the second connection electrode through a fourth contact hole passing through the at least one sensor insulating layer.

30. The display device of claim 29, wherein an edge of the base layer is closer to the fourth contact hole than to the first contact hole, the second contact hole, and the third contact hole.

31. The display device of claim 30, wherein the third contact hole overlaps the outer region.

32. The display device of claim 31, wherein the fourth contact hole overlaps the outer region.

33. The display device of claim 27, wherein the base layer has a substantially quadrangle shape, and a border line between the display region and the non-display region in a corner region of the base layer is substantially curved when viewed in the plan view, and the second connection electrode overlaps the outer region in the corner region of the base layer.

34. The display device of claim 27, wherein the signal line comprises a data line further overlapping the display region and electrically connected to the transistor.

35. The display device of claim 34, further comprising a static electricity protection circuit electrically connected to the data line, and a distance between the static electricity protection circuit and the display region is smaller than a distance between the first connection electrode and the display region.

36. A display device comprising:

a display panel including a display region and a non-display region, the display panel including:

a base layer overlapping the display region and the non-display region;

a pad electrode exposed through a lower surface of the base layer;

a pixel disposed on an upper surface of the base layer and including a light-emitting element overlapping the display region and a transistor electrically connected to the light-emitting element;

a data line disposed on the upper surface of the base layer, overlapping the display region and the non-display region, and electrically connected to the transistor;

a static electricity protection circuit electrically connected to the data line;

a connection electrode electrically connecting the data line and the pad electrode in the non-display region; and an encapsulation layer disposed on the upper surface of the base layer and covering the light-emitting element, the encapsulation layer including:

a first inorganic encapsulation layer overlapping the display region and the non-display region;

a second inorganic encapsulation layer disposed on the first inorganic encapsulation layer; and an organic encapsulation layer disposed between the first inorganic encapsulation layer and the second inorganic encapsulation layer, wherein in a plan view, the encapsulation layer including an outer region in which the first inorganic encapsulation layer and the second inorganic encapsulation layer are in contact and an inner region in which the organic encapsulation layer is disposed, the outer region including a first outer region, and a second outer region extending outward in the plan view from the first outer region and having a smaller thickness than thickness of the first outer region, and the static electricity protection circuit overlaps the first outer region.

37. The display device of claim 36, wherein the static electricity protection circuit comprises:

a first transistor diode-connected to a first power voltage line receiving a first voltage from the data line; and a second transistor diode-connected to the data line from a second voltage line receiving a second voltage lower than the first voltage.

* * * * *